(12) United States Patent
Cho et al.

(10) Patent No.: US 12,550,327 B2
(45) Date of Patent: Feb. 10, 2026

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Siyeon Cho, Yongin-si (KR); Hyunmook Choi, Suwon-si (KR); Jihong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 289 days.

(21) Appl. No.: 18/308,393

(22) Filed: Apr. 27, 2023

(65) Prior Publication Data
US 2024/0015967 A1 Jan. 11, 2024

(30) Foreign Application Priority Data
Jul. 8, 2022 (KR) .................. 10-2022-0084226

(51) Int. Cl.
*H10B 43/27* (2023.01)
(52) U.S. Cl.
CPC .................... *H10B 43/27* (2023.02)
(58) Field of Classification Search
CPC ........ H10B 43/27; H10B 43/50; H10B 43/10; H10B 43/35; H10B 43/40; H10B 41/27; H10B 41/35; H10B 41/50
See application file for complete search history.

(56) References Cited

U.S. PATENT DOCUMENTS

| | | | |
|---|---|---|---|
| 8,847,302 B2 * | 9/2014 | Alsmeier | H10D 64/683 |
| | | | 257/390 |
| 9,041,090 B2 | 5/2015 | Simsek-Ege et al. | |
| 10,381,371 B2 | 8/2019 | Ogawa et al. | |
| 10,714,495 B2 | 7/2020 | Jo et al. | |
| 10,879,265 B2 | 12/2020 | Freeman et al. | |
| 10,930,672 B2 * | 2/2021 | Cho | H10B 63/845 |
| 2020/0194455 A1 * | 6/2020 | Cho | H10B 41/35 |
| 2024/0015967 A1 * | 1/2024 | Cho | H10B 43/27 |

FOREIGN PATENT DOCUMENTS

| | | |
|---|---|---|
| KR | 10-2019-0064852 | 6/2019 |
| KR | 10-2021-0085417 A | 7/2021 |

OTHER PUBLICATIONS

Office Action dated Dec. 19, 2025 issued in corresponding to Korean Patent Application No. 10-2022-0084226.

* cited by examiner

*Primary Examiner* — Jarrett J Stark
(74) *Attorney, Agent, or Firm* — Morgan, Lewis & Bockius LLP

(57) ABSTRACT

In a method of manufacturing a semiconductor device, an insulation layer and a first gate electrode layer are alternately and repeatedly formed on a substrate in a first direction perpendicular to an upper surface of the substrate to form a mold layer. The first gate electrode layer includes silicon doped with impurities having a first conductivity type. An opening is formed through the mold layer to expose the upper surface of the substrate. Portions of the first gate electrode layers adjacent to the opening are removed to form gaps, respectively. Horizontal channels are formed in the gaps, respectively. Each of the horizontal channels includes silicon doped with impurities having a second conductivity type. A vertical gate structure extending in the first direction is formed in the opening. A memory channel structure is formed through the mold layer to contact the upper surface of the substrate.

19 Claims, 36 Drawing Sheets

SEMICONDUCTOR DEVICE AND METHOD OF MANUFACTURING THE SAME

CROSS-REFERENCE TO RELATED APPLICATIONS

This U.S. non-provisional patent application claims priority under 35 USC § 119 to Korean Patent Application No. 10-2022-0084226, filed on Jul. 8, 2022 in the Korean Intellectual Property Office (KIPO), the disclosure of which is incorporated by reference in its entirety.

TECHNICAL FIELD

The inventive concepts relate to a semiconductor device and a method of manufacturing the same.

DISCUSSION OF RELATED ART

An electronic system may include a semiconductor memory device to store data. However, when a data storage capacity of the semiconductor memory device is too low, the electronic system may be unable to store all of the data it requires. Thus, a method of increasing the data storage capacity of the semiconductor memory device has been studied. For example, a semiconductor memory device including memory cells that are 3-dimensionally stacked has been suggested.

As the number of the memory cells 3-dimensionally stacked in the semiconductor device increases, areas of pads contacting contact plugs for transferring electrical signals to the memory cells increase, and thus the integration degree of the semiconductor device may not increase.

SUMMARY

At least one embodiment of the inventive concept provides a method of manufacturing a semiconductor device having increased data storage capacity.

At least one embodiment of the inventive concept provides a semiconductor device having increased data storage capacity.

According to an aspect of the inventive concept, there is provided a method of manufacturing a semiconductor device. In the method, an insulation layer and a first gate electrode layer are alternately and repeatedly formed on a substrate in a first direction (e.g., perpendicular or substantially perpendicular to an upper surface of the substrate) to form a mold layer. The first gate electrode layer has a first conductivity type (e.g., may include silicon or polysilicon doped with impurities having the first conductivity type). An opening is formed through the mold layer to expose the upper surface of the substrate. Portions of the first gate electrode layers adjacent to the opening are removed to form gaps, respectively. Horizontal channels are formed in the gaps, respectively. Each of the horizontal channels has a second conductivity type that is opposite to the first conductivity type (e.g., may include silicon or polysilicon doped with impurities having the second conductivity type). A vertical gate structure extending in the first direction is formed in the opening. A memory channel structure is formed through the mold layer to contact the upper surface of the substrate.

According to an aspect of the inventive concept, there is provided a method of manufacturing a semiconductor device. In the method, an insulation layer and a first gate electrode layer are formed alternately and repeatedly on a substrate in a first direction (e.g., perpendicular or substantially perpendicular to an upper surface of the substrate) to form a mold layer. Division patterns are formed through the mold layer. Each of the division patterns extends in a second other direction (e.g., parallel or substantially parallel to the upper surface of the substrate), and the division patterns are spaced apart from each other in a third direction (e.g., parallel or substantially parallel to the upper surface) crossing the second direction. A portion of each of the first gate electrode layers between the division patterns is converted into a horizontal channel. A vertical gate structure extending in the first direction is formed through the horizontal channel. A memory channel structure is formed through the mold layer to contact the upper surface of the substrate.

According to an aspect of the inventive concept, there is provided a method of manufacturing a semiconductor device. In the method, an insulation layer and a first gate electrode layer are formed alternately and repeatedly on a substrate in a first direction (e.g., perpendicular or substantially perpendicular to an upper surface of the substrate) to form a mold layer. An end portion in a second direction of the mold layer is partially removed so that steps are formed in a third direction. Each of the steps includes one of the first gate electrode layers and one of the insulation layers directly on the first gate electrode layer. The second and third directions cross each other. The second and third directions may be parallel or substantially parallel to the upper surface of the substrate. Division patterns are formed through the mold layer. Each of the division patterns extend in the second direction, and the division patterns are spaced apart from each other in the third direction. An opening is formed through a portion of the mold layer between a pair of the division patterns neighboring in the third direction. Portions of the first gate electrode layers adjacent to the opening are removed to form gaps exposing sidewalls of the division patterns. A horizontal channel is formed in each of the gaps. A vertical gate structure extending in the first direction is formed in the opening. A memory channel structure is formed through the mold layer to contact the upper surface of the substrate. First contact plugs are formed to contact upper surfaces of respective portions of the first gate electrode layers at which the steps are formed.

According to an aspect of the inventive concept, there is provided a semiconductor device. The semiconductor device includes first gate electrodes stacked on a substrate in a first direction (e.g., perpendicular or substantially perpendicular to an upper surface of the substrate), each of which may extend in a second other direction (e.g., parallel or substantially parallel to the upper surface of the substrate); horizontal channels contacting end portions in the second direction of the first gate electrodes, respectively; gate electrode connection portions contacting the horizontal channels, respectively; pads contacting the gate electrode connection portions, respectively; a vertical gate structure extending in the first direction through the horizontal channels on the substrate; and a memory channel structure extending through the first gate electrodes in the first direction on substrate. Each of the horizontal channels surrounds a sidewall of the vertical gate structure.

According to an aspect of the inventive concept, there is provided a semiconductor device. The semiconductor device includes first gate electrodes stacked on a substrate in a first direction (e.g., perpendicular or substantially perpendicular to an upper surface of the substrate), each of which extends in a second other direction (e.g., parallel or substantially parallel to the upper surface of the substrate); horizontal channels contacting end portions in the second direction of the first gate electrodes, respectively; gate electrode connection portions contacting the horizontal channels, respectively; pads contacting the gate electrode connection portions, respectively; a vertical gate structure extending in the first direction through the horizontal channels on the substrate; and a memory channel structure extending through the first gate electrodes in the first direction on substrate. An upper surface of the vertical gate structure is coplanar or substantially coplanar with an upper surface of an uppermost one of the first gate electrodes.

According to an aspect of the inventive concept, there is provided a semiconductor device. The semiconductor device includes first gate electrode structures, horizontal channel structures, gate electrode connection portions, pads, vertical gate structures, memory channel structures, first division patterns, second division patterns and third division patterns. The first gate electrode structures is formed on a first region of a substrate including the first region, a second region and a third region. Each of the first gate electrode structures includes first gate electrodes stacked on the substrate in a first direction (e.g., perpendicular or substantially perpendicular to an upper surface of the substrate). Each of the first gate electrodes extends in a second other direction (e.g., parallel or substantially parallel to the upper surface of the substrate). The first gate electrode structures are disposed in a third direction crossing the second direction. The third direction may be parallel or substantially parallel to the upper surface of the substrate. The horizontal channel structures is formed on the second region of the substrate. Each of the horizontal channel structures include horizontal channels contacting end portions in the second direction of the first gate electrodes, respectively. The horizontal channel structures are disposed in the third direction. The gate electrode connection portions are formed on the third region of the substrate. Each of the gate electrode connection portions extend in the third direction and commonly contacts the horizontal channels disposed in the third direction. The pads are formed on the third region of the substrate, and contact the gate electrode connection portions, respectively. The vertical gate structures are formed on the second region of the substrate. Each of the vertical gate structures extend in the first direction through a corresponding one of the horizontal channel structures. The memory channel structures are formed on the first region of the substrate. Each of the memory channel structures extend in the first direction through a corresponding one of the first gate electrodes. The first division patterns contact the upper surface of the substrate. Each of the first division patterns extend in the second direction between the first gate electrode structures and between the horizontal channel structures on the first and second regions of the substrate. The second division patterns may contact the upper surface of the substrate. Each of the second division patterns may extend in the second direction between the horizontal channel structures on the second region of the substrate. The third division patterns may extend in the second direction on the first region of the substrate. The third division patterns may be connected to corresponding ones of the second division patterns, respectively. Each of the first division patterns may be disposed between the memory channel structures, and each of the third division patterns may extend through upper portions of ones of the memory channel structures.

In the method of manufacturing the semiconductor device in accordance with an example embodiment, an opening may be formed through a mold layer, a portion of a first gate electrode adjacent to the opening may be removed to form a gap, forming a horizontal channel in the gap, and forming a vertical gate structure including a second gate electrode in a remaining portion of the opening. Thus, a block transistor including the vertical gate structure and the horizontal channel may be easily formed.

DETAILED DESCRIPTION

Hereinafter, a semiconductor device, a method for manufacturing the same, and a mass data storage system including the semiconductor device in accordance with example embodiments will be described in detail with reference to the accompanying drawings. It will be understood that, although the terms "first," "second," and/or "third" may be used herein to describe various elements, these elements should not be limited by these terms. These terms are only used to distinguish one element from another element.

Figure 1:
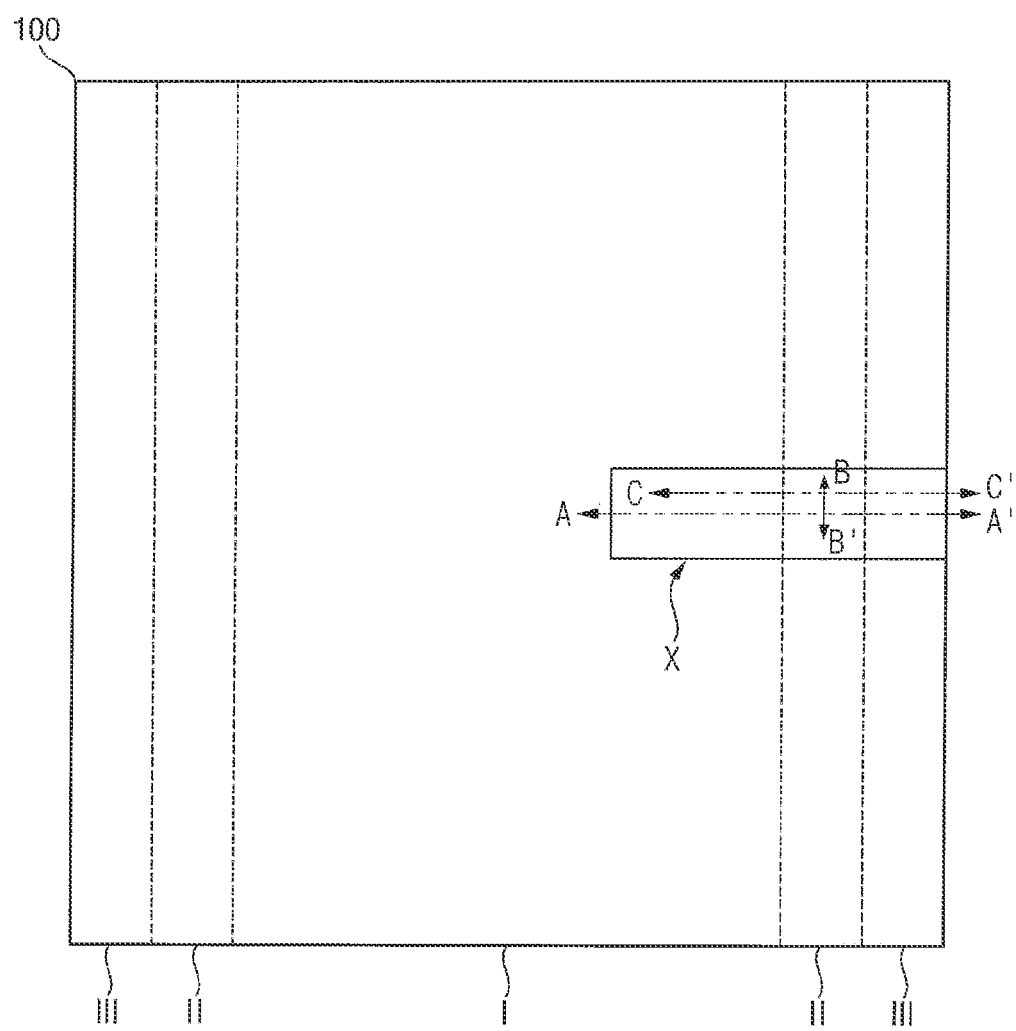
FIGS. 1 to 5 are a plan view, a prospective view and cross-sectional views illustrating a semiconductor device in accordance with an example embodiment.
Figure 2:
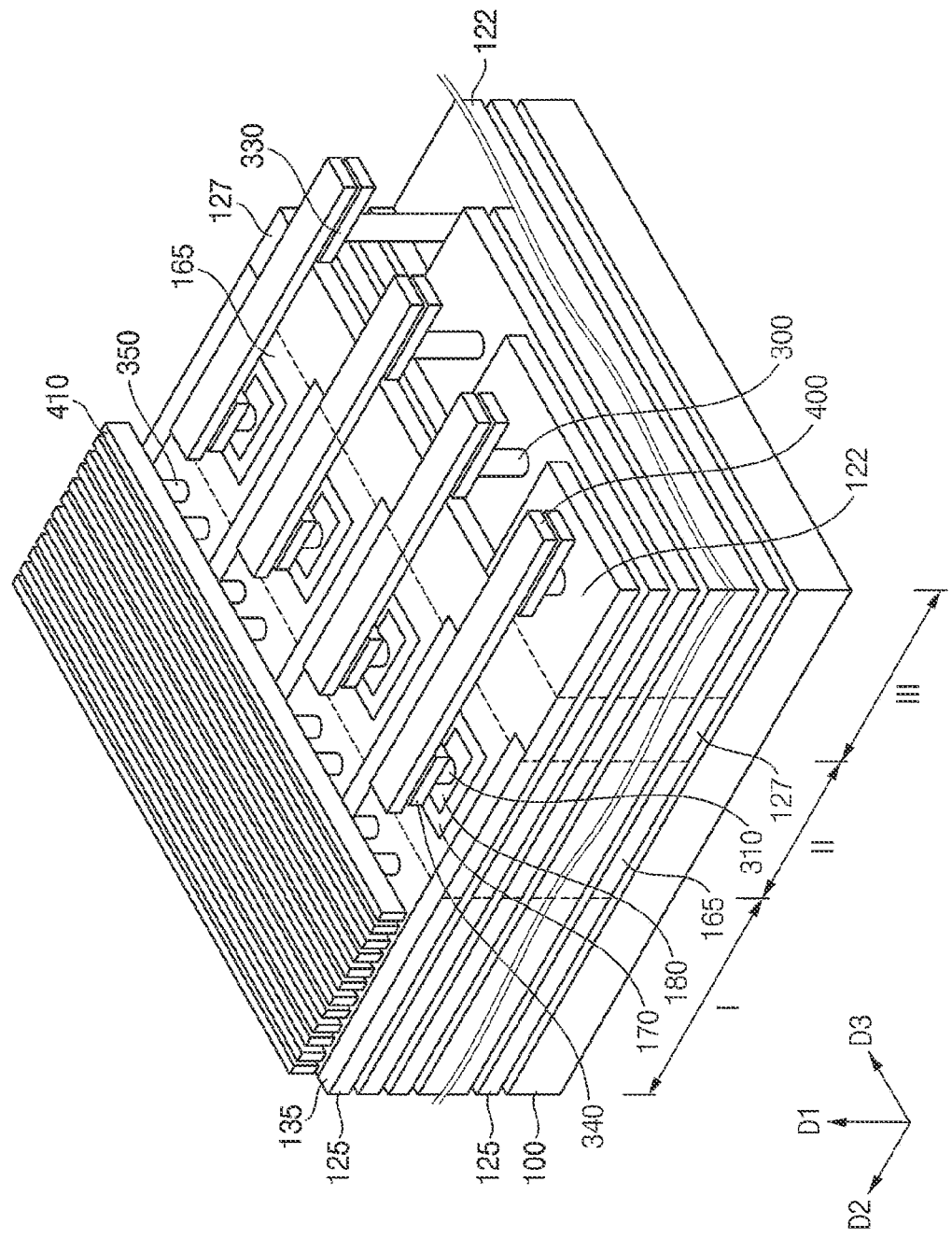
Figure 3:
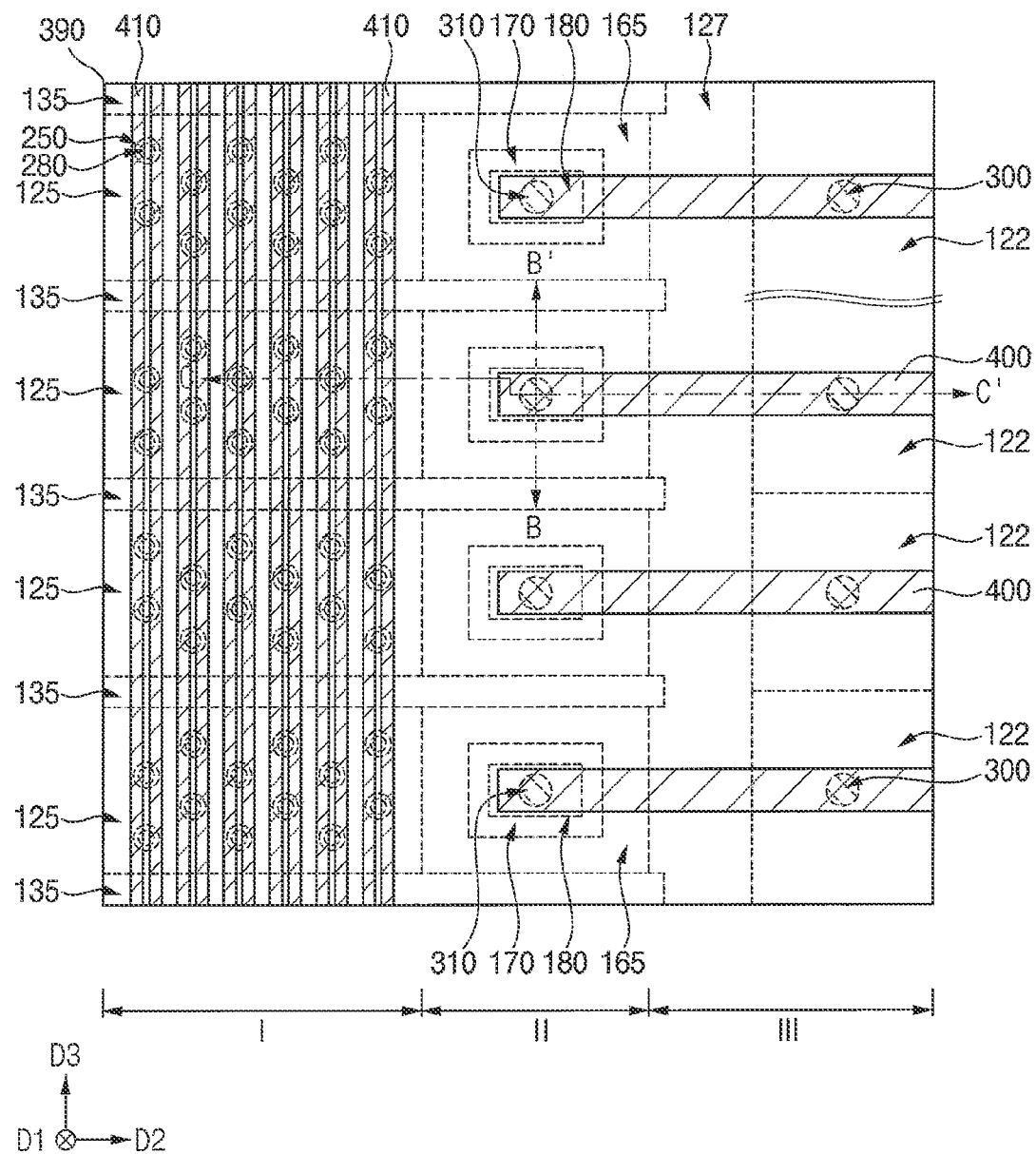
Figure 4:
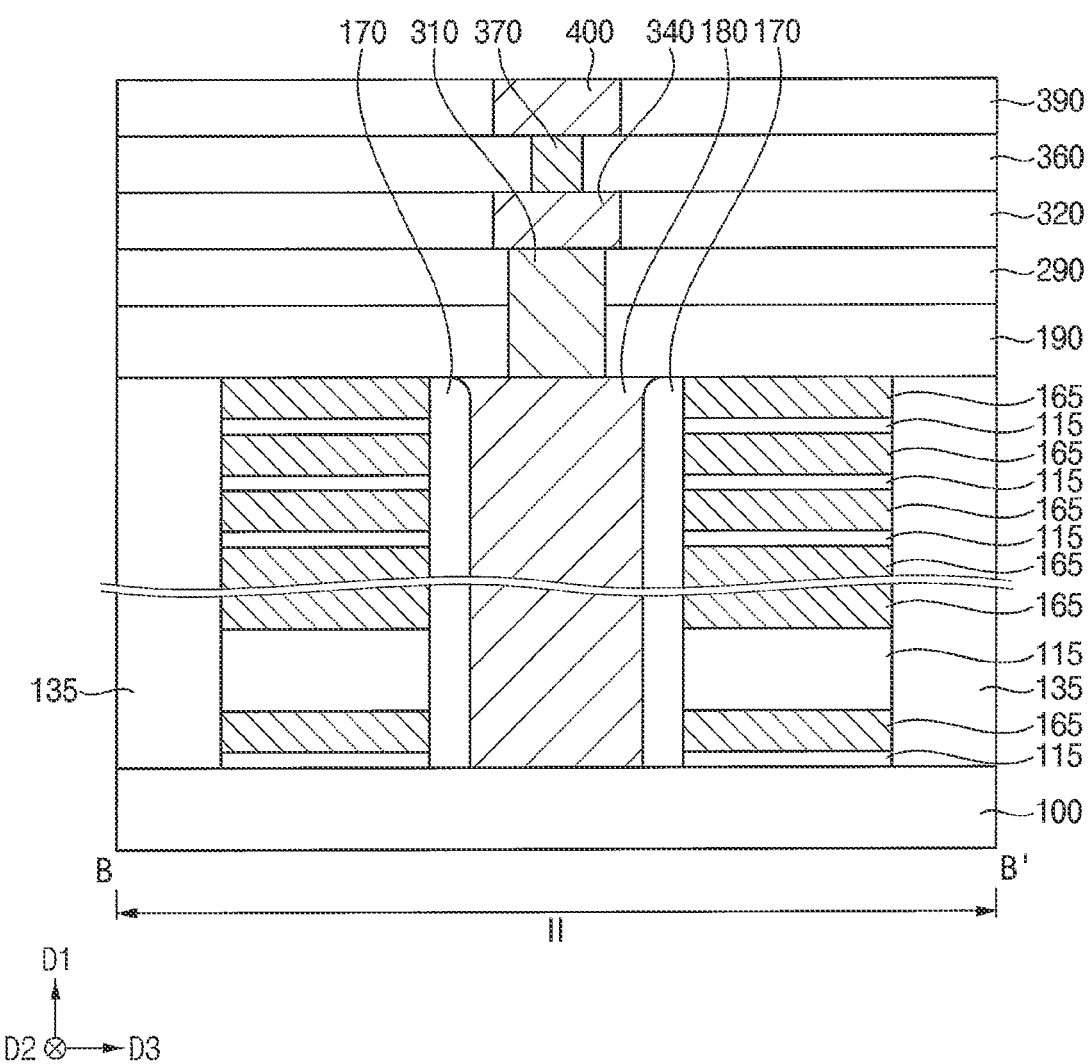
Figure 5:
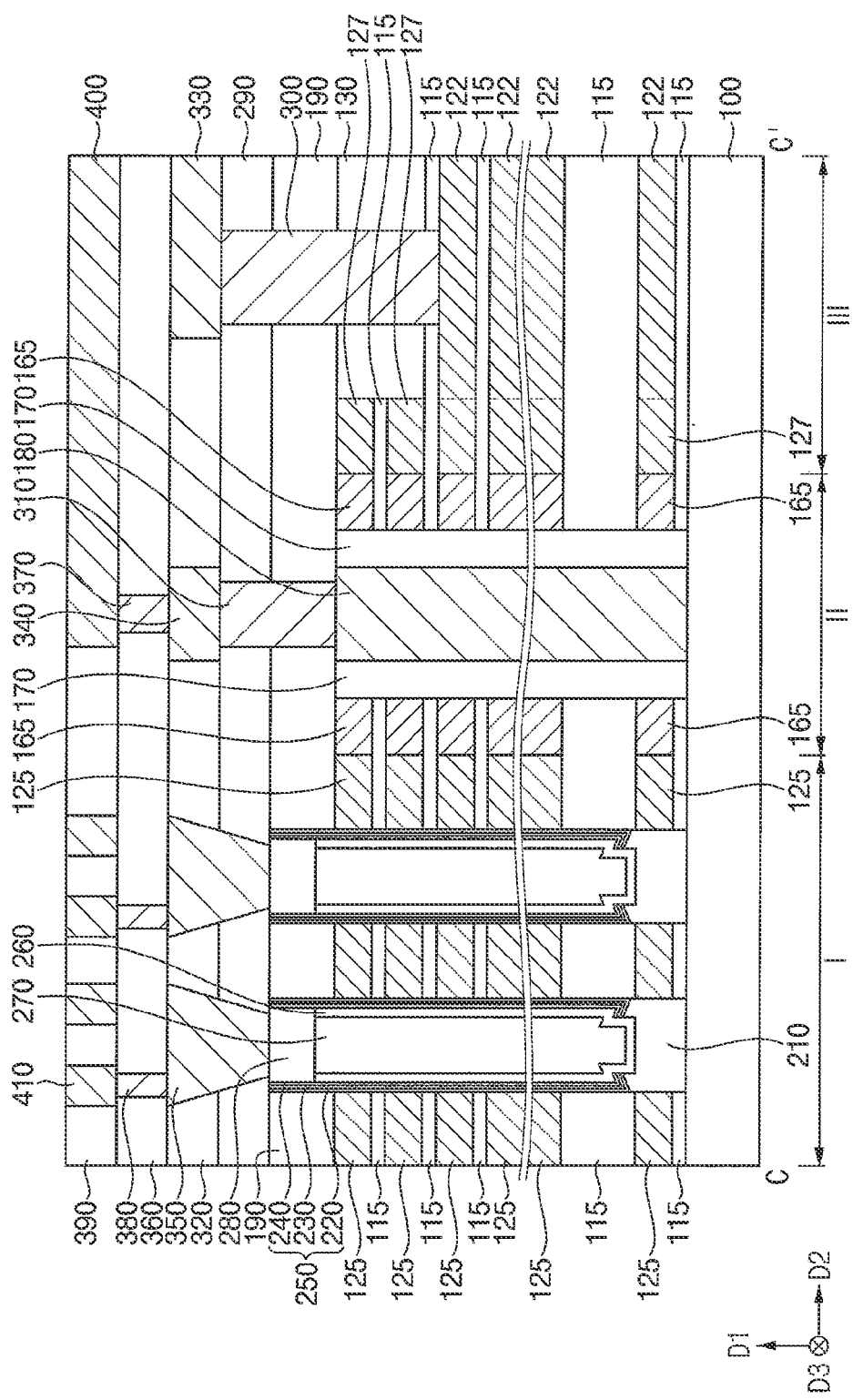

In the specification (and not necessarily in the claims), a vertical direction perpendicular or substantially perpendicular to an upper surface of a substrate may be referred to as a first direction D1, and two directions crossing each other among horizontal directions parallel or substantially parallel to the upper surface of the substrate may be referred to as second and third directions D2 and D3, respectively. In example embodiments, the second and third directions are perpendicular or substantially perpendicular to each other. In an alternate embodiment, the first direction D1 may disposed at an angle less or more than 90 degrees from an upper surface of a substrate; and the second direction D2 and the third direction D3 may cross each other at an angle less or more than 90 degrees, FIGS. 1 to 5 are a plan view, a prospective view and cross-sectional views illustrating a semiconductor device, for example, a vertical channel NAND flash memory device in accordance with example embodiments. Particularly, FIGS. 1 and 3 are the plan view, FIG. 2 is the prospective view, and FIGS. 4 and 5 are the cross-sectional views.

FIG. 4 is a cross-sectional view taken along line B-B' of FIG. 3, and FIG. 5 is a cross-sectional view taken along line C-C' of FIG. 3. FIGS. 2 to 5 are drawings about region X in FIG. 1. FIG. 2 may not show certain elements to increase readability of the drawing.

Referring to FIGS. 1 to 5, the semiconductor device may include a first gate electrode structure, a horizontal channel structure, a gate electrode connection portion 127, a pad 122, a vertical gate structure, a first division pattern 135 and a memory channel structure disposed on a first substrate 100.

Additionally, the semiconductor device may include an insulation pattern 115, a first insulating interlayer pattern 130, second to sixth insulating interlayers 190, 290, 320, 360 and 390, first and second contact plugs 300 and 310, first and second vias 350 and 370, first to third wirings 330, 340 and 380, a fourth wiring, and fifth and sixth wirings 400 and 410.

The first substrate 100 may include a semiconductor material, e.g., silicon, germanium, silicon-germanium, etc., or a III-V group compound semiconductor, e.g., GaP, GaAs, GaSb, etc. In example embodiments, the first substrate 100 may be a silicon-on-insulator (SOI) substrate or a germanium-on-insulator (GOI) substrate.

In example embodiments, the first substrate 100 may include a first region I, a third region III at each of opposite sides in the second direction D2 of the first region I, and a second region II located between the first and third regions I and III. The first substrate 100 may further include a fourth region surrounding the first to third regions I, II and III.

The first region I may be a cell array region on which memory cells are formed, the third region III may be an extension region on which contact plugs connected to wirings for applying electrical signals to the memory cells are formed, and the second region II may be a block selection region on which a block selection transistor for selecting blocks included in the memory cells are formed, and the fourth region may be a peripheral circuit region on which peripheral circuits are formed.

The first gate electrode structure may include first gate electrodes 125 spaced apart from each other in the first direction D1 on the first region I of the first substrate 100. Each of the first gate electrodes 125 may extend in the second direction D2. In an example embodiment, a plurality of first gate electrode structures are spaced apart from each other in the third direction D3.

In an example embodiment, each of the first gate electrodes 125 include silicon or polysilicon doped with impurities having a first conductivity type. Thus, in an example embodiment, each of the first gate electrodes 125 may include silicon or polysilicon doped with p-type impurities. Alternatively, each of the first gate electrodes 125 may include silicon or polysilicon doped with n-type impurities.

In example embodiments, the first gate electrode structure may include a ground selection line (GSL), one or more word lines and a string selection line (SSL). For example, a lowermost one of the first gate electrodes 125 may serve as the GSL, an uppermost one and a second one from above of the first gate electrodes 125 may serve as the SSL, and other ones of the first gate electrodes 125 may serve as the word lines, however the inventive concept is not limited thereto.

The horizontal channel structure may be formed on the second region II of the first substrate 100, and may include horizontal channels 165 stacked in the first direction D1 where each of the horizontal channels 165 may contact an end portion in the second direction D2 of a corresponding one of the first gate electrodes 125. In an example embodiment, a plurality of horizontal channel structures are spaced apart from each other in the third direction D3.

In an example embodiment, each of the horizontal channels 165 include silicon or polysilicon doped with impurities having a second conductivity type that is opposite to the first conductivity type. Thus, in an example embodiment, each of the horizontal channels 165 may include silicon or polysilicon doped with n-type impurities. Alternatively, each of the horizontal channels 165 may include silicon or polysilicon doped with p-type impurities.

The gate electrode connection portion 127 may be formed on the third region III of the first substrate 100, and may extend in the third direction D3 to contact an end portion in the second direction D2 of the horizontal channel 165 at each level.

In an example embodiment, the gate electrode connection portion 127 includes substantially the same material as the first gate electrode 125, that is, silicon or polysilicon doped with impurities having the first conductivity type.

The pad 122 may be formed on the third region III of the first substrate 100, and may contact a sidewall in the second direction D2 of the gate electrode connection portion 127 at each level. In an example embodiment, the pads 122 are arranged in a staircase shape in the third direction D3. That is, in an embodiment, areas of the pads 122 decrease from a lowermost level toward an uppermost level, and thus a portion of each of the pads 122 are not overlapped with upper ones of the pads 122 in the first direction D1.

In an example embodiment, the pads 122 include substantially the same material as the first gate electrode 125, that is, silicon or polysilicon doped with impurities having the first conductivity type.

The insulation pattern 115 may be formed between the first gate electrodes 125 stacked in the first direction D1, between the horizontal channels 165 stacked in the first direction D1, between the gate electrode connection portions 127 stacked in the first direction D1, and between the pads 122 stacked in the first direction D1. The insulation pattern 115 may include an oxide, e.g., silicon oxide.

The first division pattern 135 may be formed on the first and second regions I and II of the first substrate 100, and may contact an upper surface of the first substrate 100. The first division pattern 135 may extend in the second direction D2. In an example embodiment, the first division pattern 135 is formed between the first gate electrode structures on the first region I of the first substrate 100 and between the horizontal channel structures on the second region II of the first substrate 100. The first division pattern 135 may include an oxide, e.g., silicon oxide.

The vertical gate structure may be formed on the second region II of the first substrate 100, and may contact the upper surface of the first substrate 100. The vertical gate structure may extend through the horizontal channel structures. Thus, each of the horizontal channels 165 may surround a sidewall of the vertical gate structure.

In an example embodiment, the vertical gate structure includes a second gate electrode 180 extending in the first direction D1 from the upper surface of the first substrate 100 and a gate insulation pattern 170 covering a sidewall of the second gate electrode 180. In an example embodiment, an upper surface of the vertical gate structure is coplanar or substantially coplanar with an upper surface of an uppermost one of the first gate electrodes 125.

The second gate electrode 180 may include, e.g., a metal, a metal nitride, a metal silicide, etc., and the gate insulation pattern 170 may include an oxide, e.g., silicon oxide.

The memory channel structure may have a shape of a pillar extending in the first direction D1 on the first region I of the first substrate 100. In an example embodiment, the memory channel structure includes a semiconductor pattern 210 contacting the upper surface of the first substrate 100, a vertical channel 260 contacting a central upper surface of the semiconductor pattern 210 and having a cup shape, a charge storage structure 250 covering an outer sidewall of the vertical channel 260 and contacting an edge upper surface of the semiconductor pattern 210, a filling pattern 270 contacting an inner sidewall of the vertical channel 260 and filling an inner space defined by the cup shaped vertical channel 260, and a capping layer 280 on the vertical channel 260 and the filling pattern 270 and contacting an upper inner sidewall of the charge storage structure 250. The cup shape may also be a pillar shape or a cylindrical shape.

The semiconductor pattern 210 may include, e.g., single crystalline silicon or polysilicon, the vertical channel 260 may include, e.g., undoped polysilicon or polysilicon lightly doped with p-type impurities, the filling pattern 270 may include an oxide, e.g., silicon oxide, and the capping layer 280 may include, e.g., polysilicon doped with n-type impurities.

In an example embodiment, the charge storage structure 250 includes a tunnel insulation pattern 240, a charge storage pattern 230 and a blocking pattern 220 sequentially stacked in the horizontal direction. The tunnel insulation pattern 240, the charge storage pattern 230 and the blocking pattern 220 may include, e.g., silicon oxide, silicon nitride and silicon oxide, respectively.

In an example embodiment, a plurality of memory channel structures are spaced apart from each other in the second and third directions D2 and D3 between ones of the first division patterns 135 neighboring in the third direction D3 on the first region I of the first substrate 100. For example, memory channel structure may be disposed between a pair of the first division patterns 135.

The first insulating interlayer pattern 130 may be formed on the third region III of the first substrate 100, and may cover the pads 122. The second to sixth insulating interlayers 190, 290, 320, 360 and 390 may be sequentially stacked on the first insulating interlayer pattern 130, the first gate electrode structure, the horizontal channel structure, the gate electrode connection portion 127, the vertical gate structure and the first division pattern 135, and may include an oxide, e.g., silicon oxide.

The first contact plug 300 may be formed on the third region III of the first substrate 100, and may extend through the insulation pattern 115, the first insulating interlayer pattern 130, and the second and third insulating interlayers 190 and 290 to contact an upper surface of a corresponding one of the pads 122. The second contact plug 310 may be formed on the second region II of the first substrate 100, and may extend through the second and third insulating interlayers 190 and 290 to contact an upper surface of a corresponding one of the second gate electrodes 180.

The first and second wirings 330 and 340 may extend through the fourth insulating interlayer 320 to contact upper surfaces of the first and second contact plugs 300 and 310, respectively. In an example embodiment, the first wiring 330 extends in the third direction D3 on the third region III of the first substrate 100.

The first via 350 may be formed on the first region I of the first substrate 100, and may extend through the third and fourth insulating interlayers 290 and 320 to contact an upper surface of a corresponding ones of the capping layers 280.

The second via 370 may extend through the fifth insulating interlayer 360 to contact an upper surface of the second wiring 340.

The third wiring 380 and the fourth wiring may extend through the fifth insulating interlayer 360. In an example embodiment, each of the third wiring 380 and the fourth wiring extend in the third direction D3 to a given length so as to contact ones of the first vias 350 disposed in the third direction D3. For example, the fourth wiring may contact and be connected to two first vias 350 relatively close to the first division pattern 135 in the third direction D3, and the third wiring 380 may contact and be connected to two first vias 350 relatively far from the first division pattern 135 in the third direction D3.

The fifth wiring 400 may extend through the sixth insulating interlayer 390, and contact an upper surface of the second via 370. In an example embodiment, the fifth wiring 400 is formed on the second and third regions II and III of the first substrate 100, and may extend in the third direction D3.

In an example embodiment, the sixth wiring 410 extends in the third direction D3 on the first region I of the first substrate 100, and a plurality of sixth wirings 410 are spaced apart from each other in the second direction D2. Each of the sixth wirings 410 may commonly contact and be connected to a plurality of third wirings 380 disposed in the third direction D3, or may commonly contact and be connected to a plurality of fourth wirings disposed in the third direction D3. In an example embodiment, each of the sixth wirings 410 may serve as a bit line of the semiconductor device.

The first and second contact plugs 300 and 310, the first to third wirings 330, 340 and 380, the fourth wiring, the fifth and sixth wirings 400 and 410, and the first and second vias 350 and 370 may include, e.g., a metal, a metal nitride, a metal silicide, etc.

In the semiconductor device, a block that is a unit for program operation and erase operation may be defined by the first division patterns 135 where each of the first division patterns 135 may extend in the second direction D2 on the first substrate 100 to divide the first gate electrode structures and the horizontal channel structures. In an embodiment, the first division patterns 135 do not divide the gate electrode connection portion 127 extending in the third direction D3 and are commonly connected to the horizontal channels 165 at each level.

Thus, when electrical signals are applied to each pad 122 from the first wiring 330 through the first contact plug 300, the electrical signals may be commonly applied to the first gate electrodes 125 disposed in the third direction D3 at each level through the gate electrode connection portion 127 that is connected to the pads 122. That is, the electrical signals may be commonly applied to a plurality of blocks disposed in the third direction D3.

However, in example embodiments, the horizontal channel 165 may be formed between each of the first gate electrodes 125 disposed in the third direction D3 and the gate electrode connection portion 127 at each level, and the horizontal channel 165 and the vertical gate structure extending through the horizontal channel 165 may collectively form a block selection transistor, so that the electrical signals may be selectively applied to only one or ones of the plurality of blocks.

The horizontal channel 165 may include silicon or polysilicon doped with impurities having the second conductivity type, the first gate electrode 125 and the gate electrode connection portion 127 may include doped with impurities having the first conductivity type, and thus the first gate electrode 125, the horizontal channel 165 and the gate electrode connection portion 127 may form, e.g., a P-N-P junction or an N-P-N junction in the second direction D2. Accordingly, the first gate electrode 125 and the gate electrode connection portion 127 may serve as a source/drain region of the block selection transistor.

For example, when a first voltage is applied from the first wiring 330 through the first contact plug 300 to each pad 122, and a second voltage is applied from the fifth wiring 400 through the second contact plug 310, the second wiring 340 and the second via 370 to the second gate electrode 180 included in the vertical gate structure. If a difference between the first and second voltages is greater than a threshold voltage of the block selection transistor, the block selection transistor is turned-on, and a voltage may be applied to the first gate electrode 125 included in a selected block. If the difference between the first and second voltages is not greater than the threshold voltage of the block selection transistor, the block selection transistor is not turned-on, and a voltage is not applied to the first gate electrode 125 included in the selected block. Thus, even though the first gate electrodes 125 and the horizontal channels 165 included in a plurality of blocks are electrically connected to each other through the gate electrode connection portion 127, electrical signals may be selectively applied to only some of the blocks.

FIGS. 6 to 28 are plan views and cross-sectional views illustrating a method of manufacturing a semiconductor device, for example, a vertical channel NAND flash memory device in accordance with an example embodiment. Particularly, FIGS. 6, 8, 10, 12, 14, 17, 19, 21, 23, 25 and 27 are the plan views, and FIGS. 7, 9, 11, 13, 15-16, 18, 20, 22, 24, 26 and 28 are the cross-sectional views.

Figure 6:
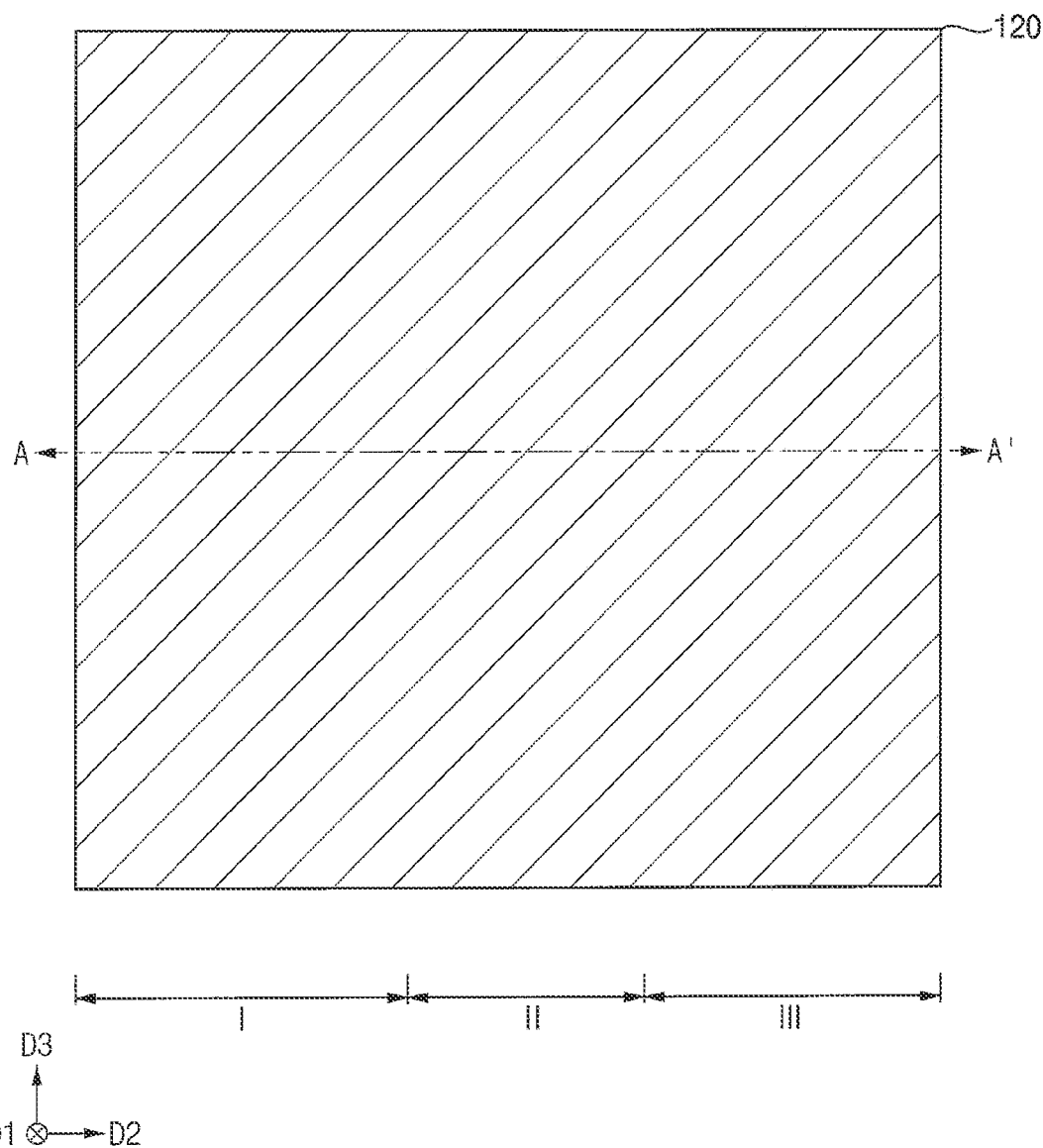
FIGS. 6 to 28 are plan views and cross-sectional views illustrating a method of manufacturing a semiconductor device in accordance with an example embodiment.
Figure 7:
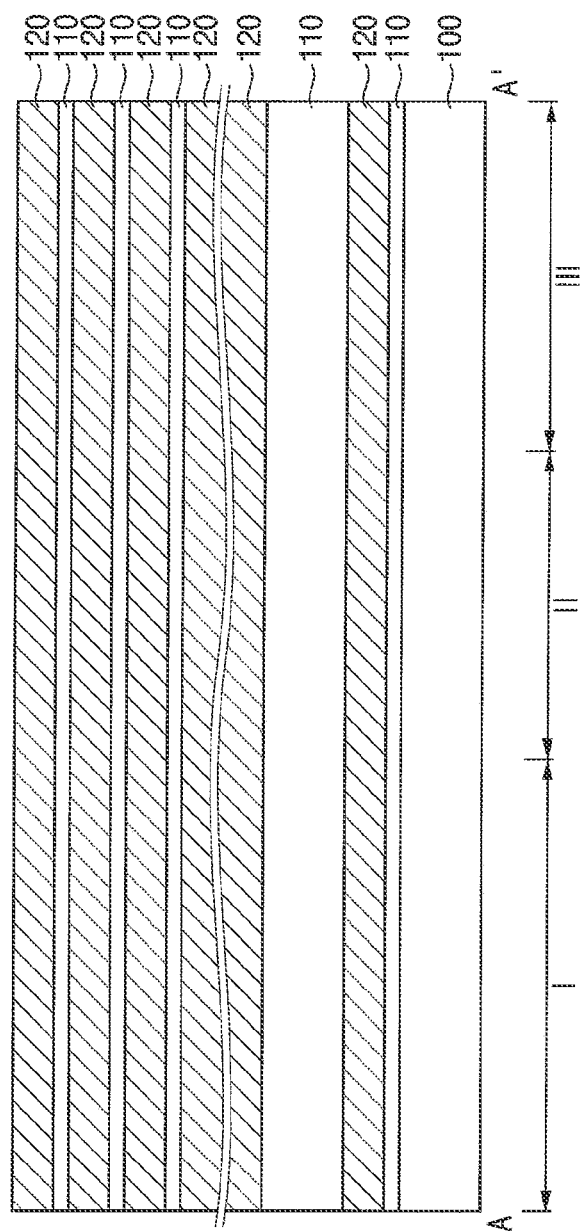
Figure 8:
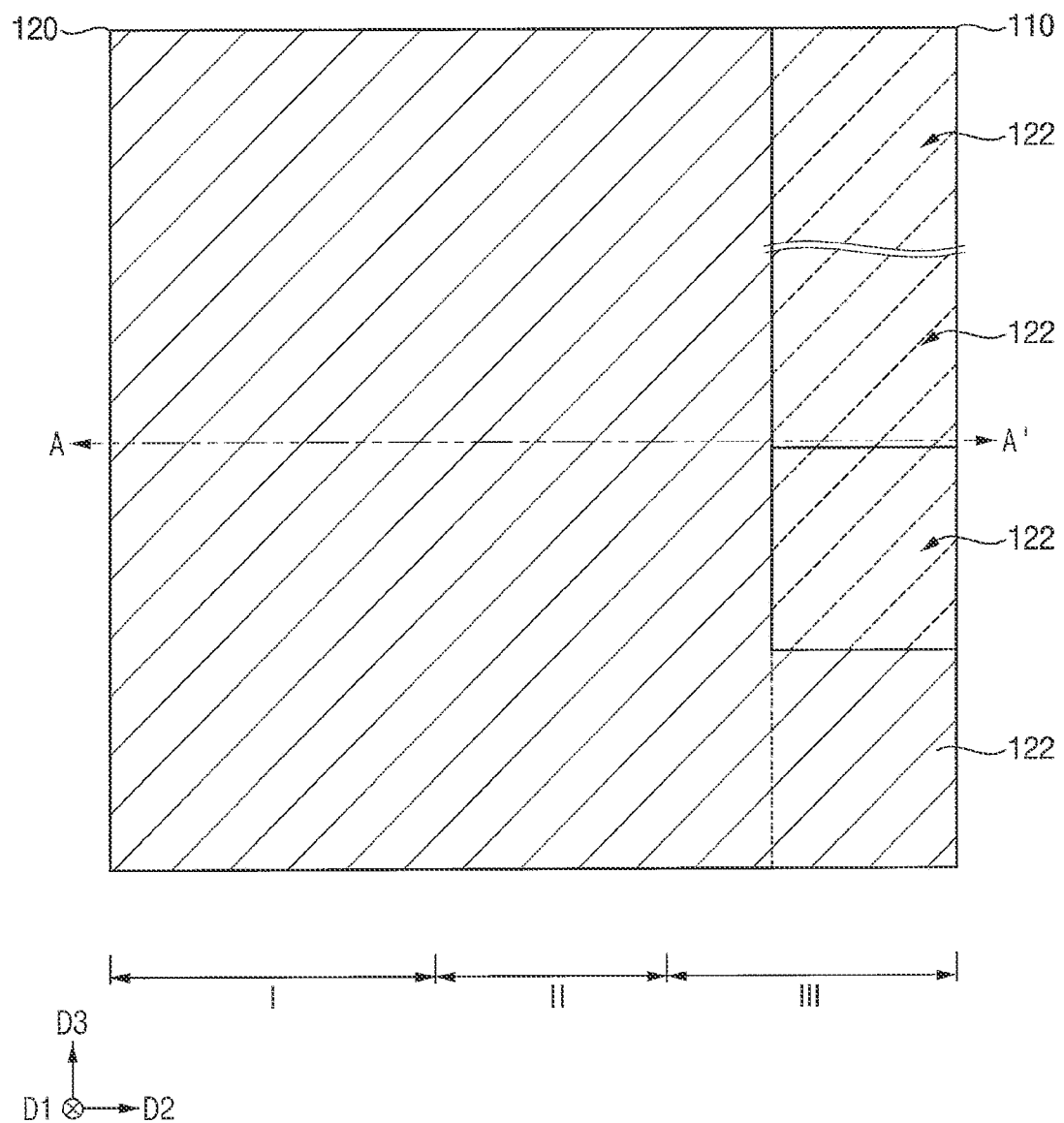
Figure 9:
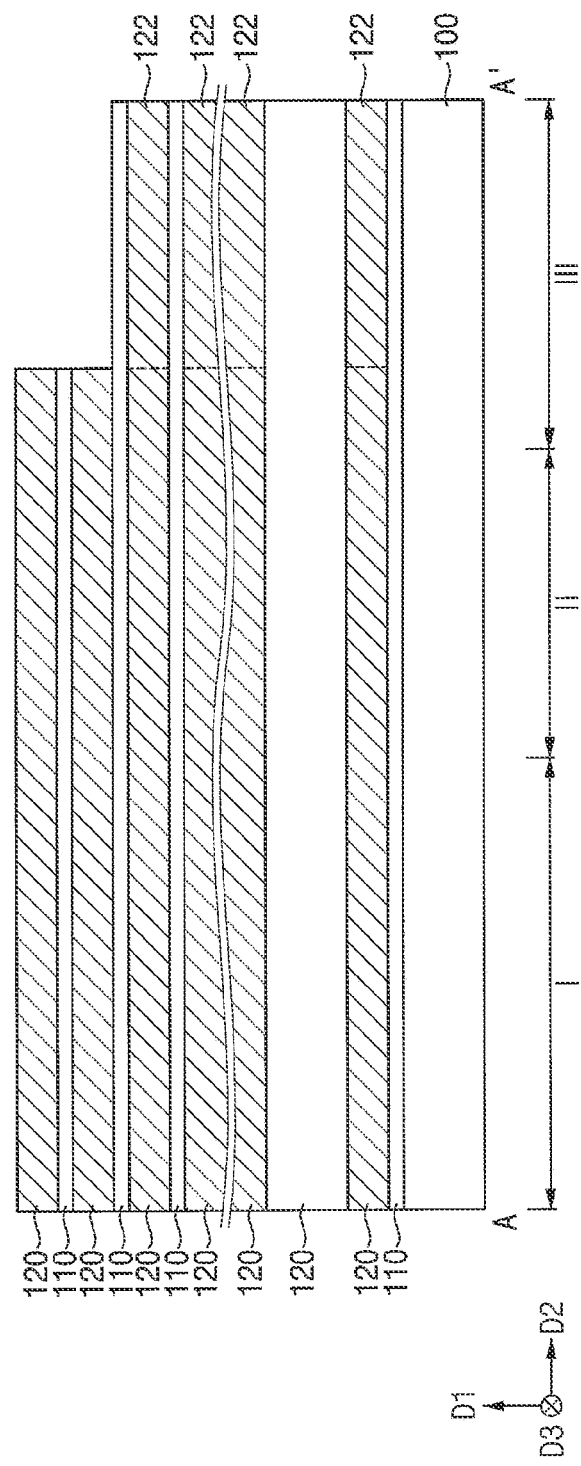
Figure 10:
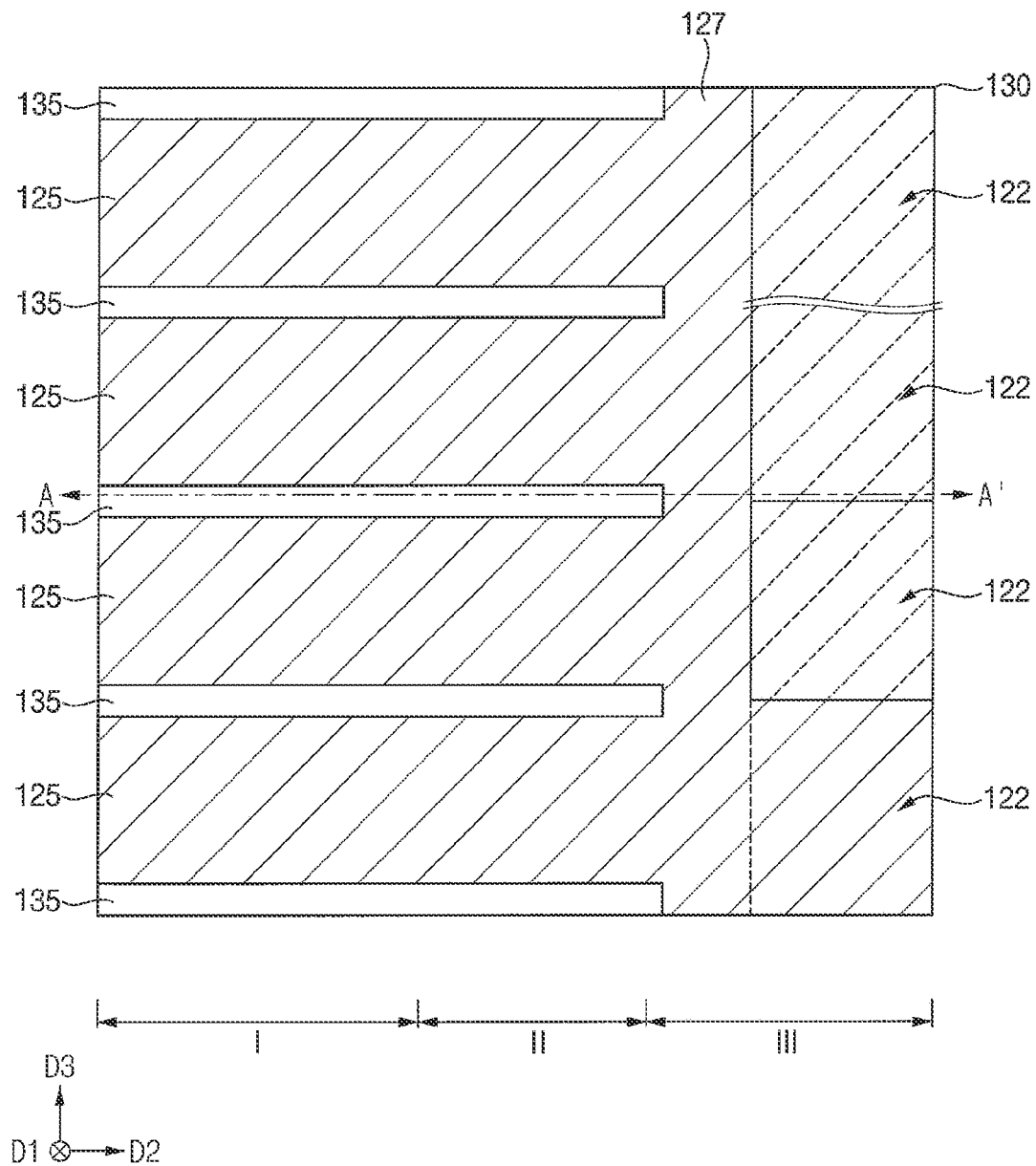
Figure 11:
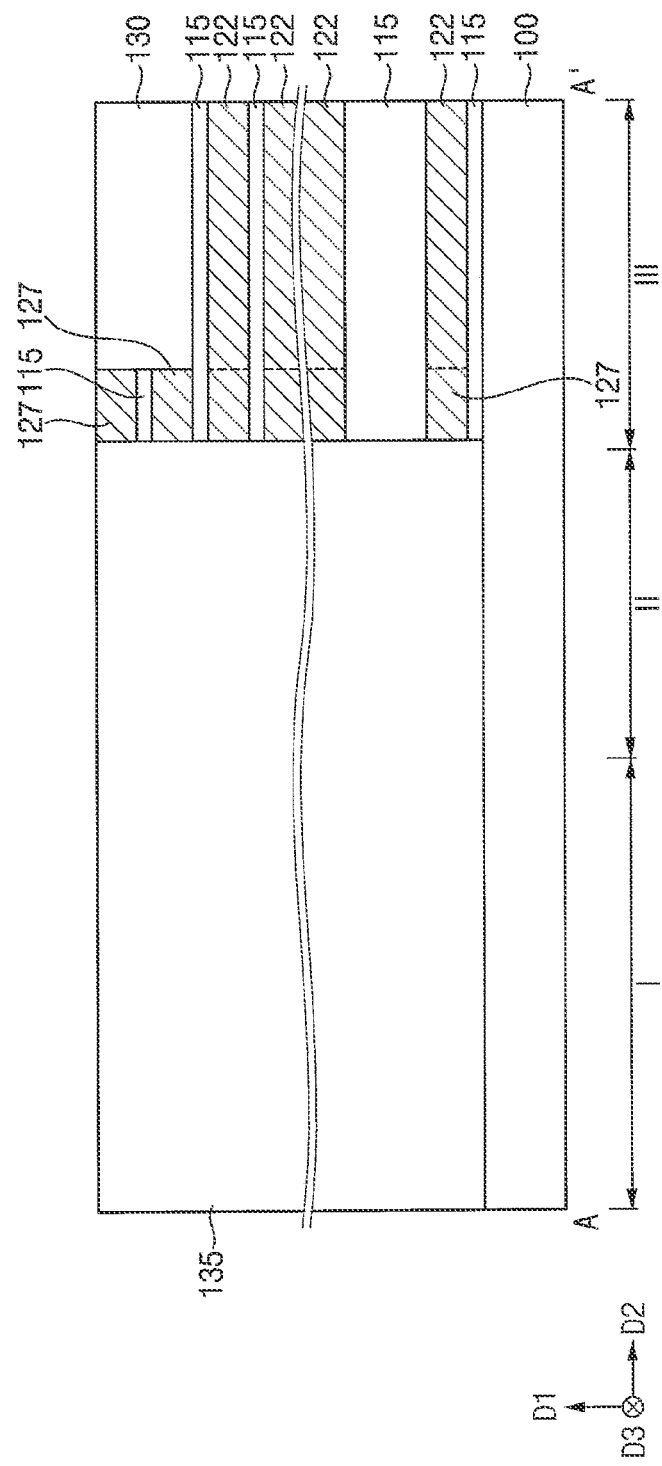
Figure 23:
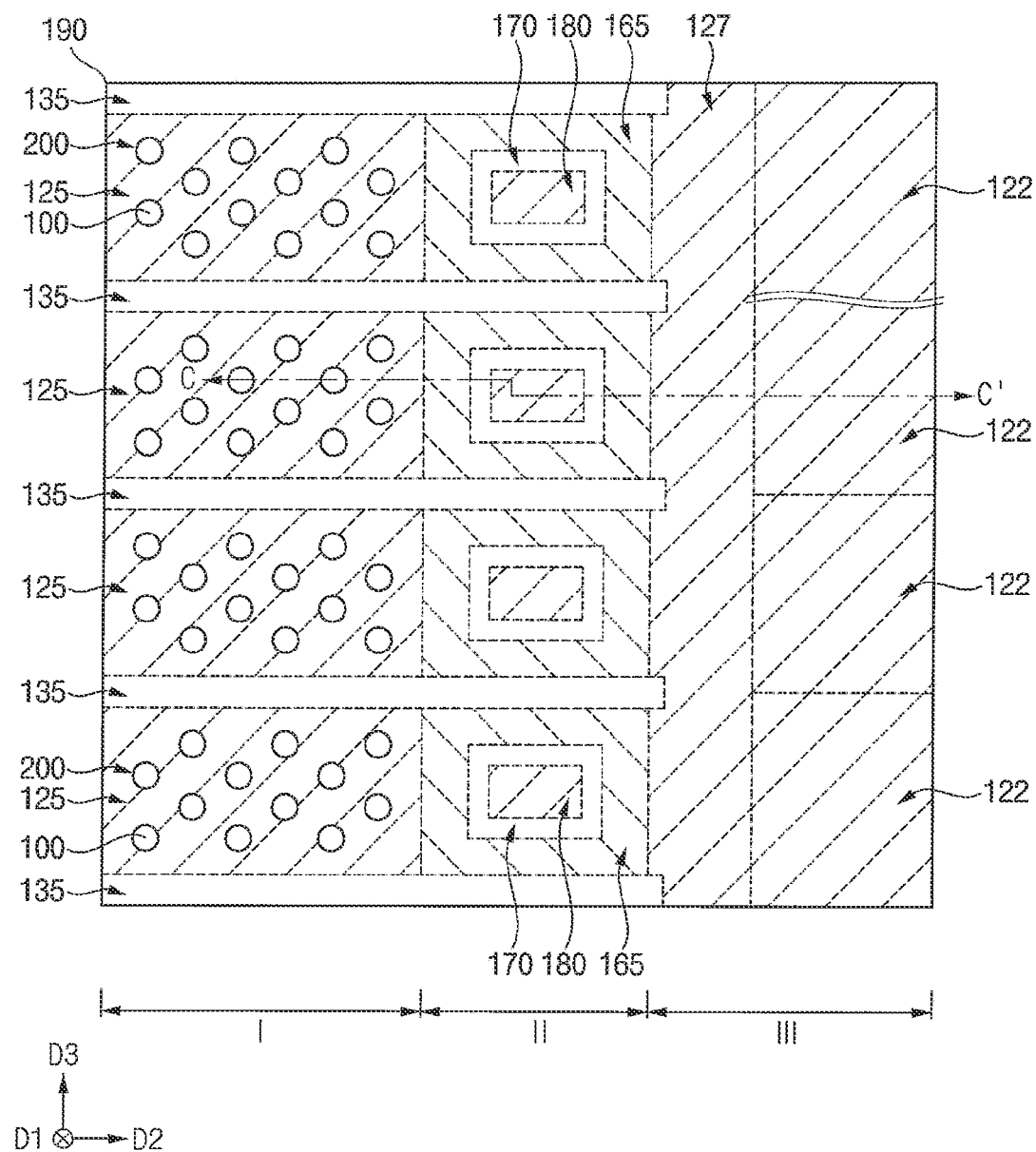
Figure 24:
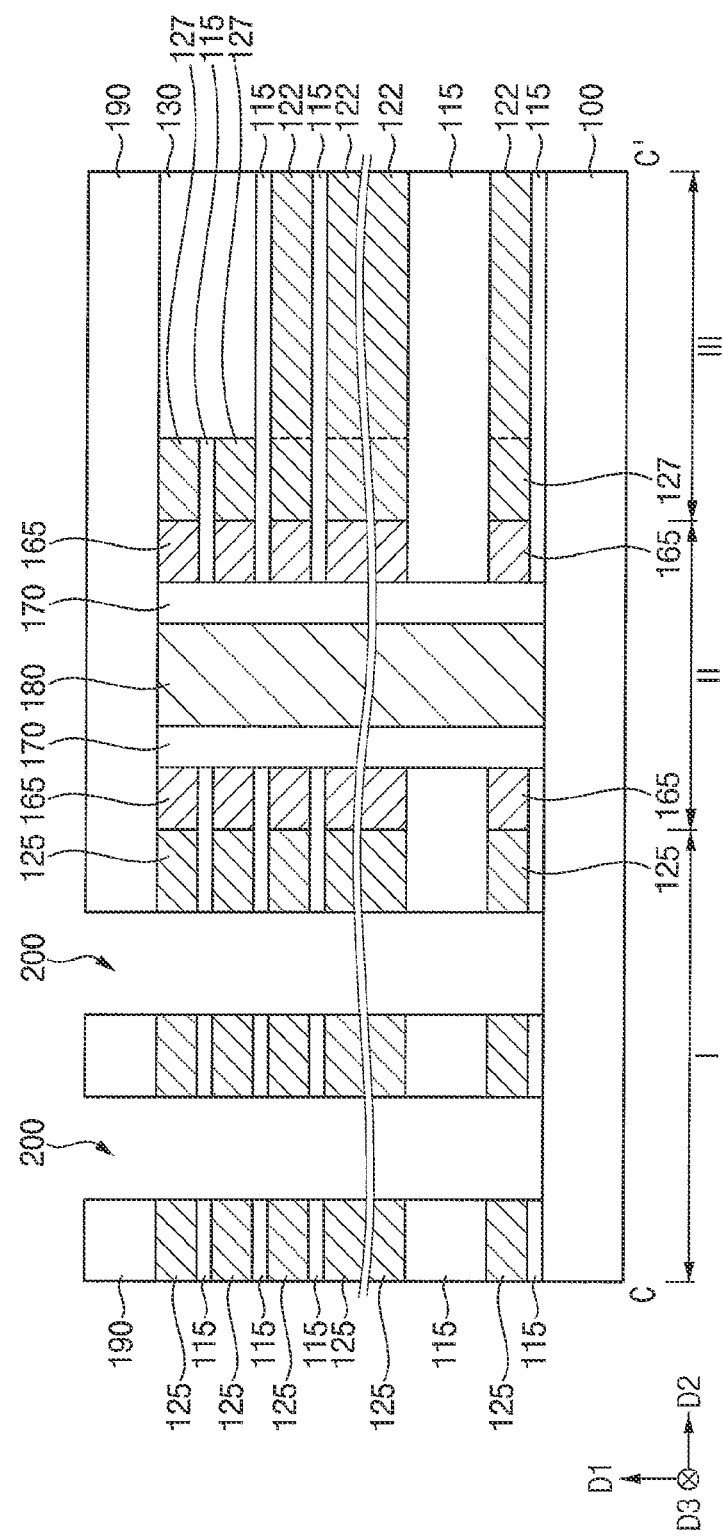
Figure 25:
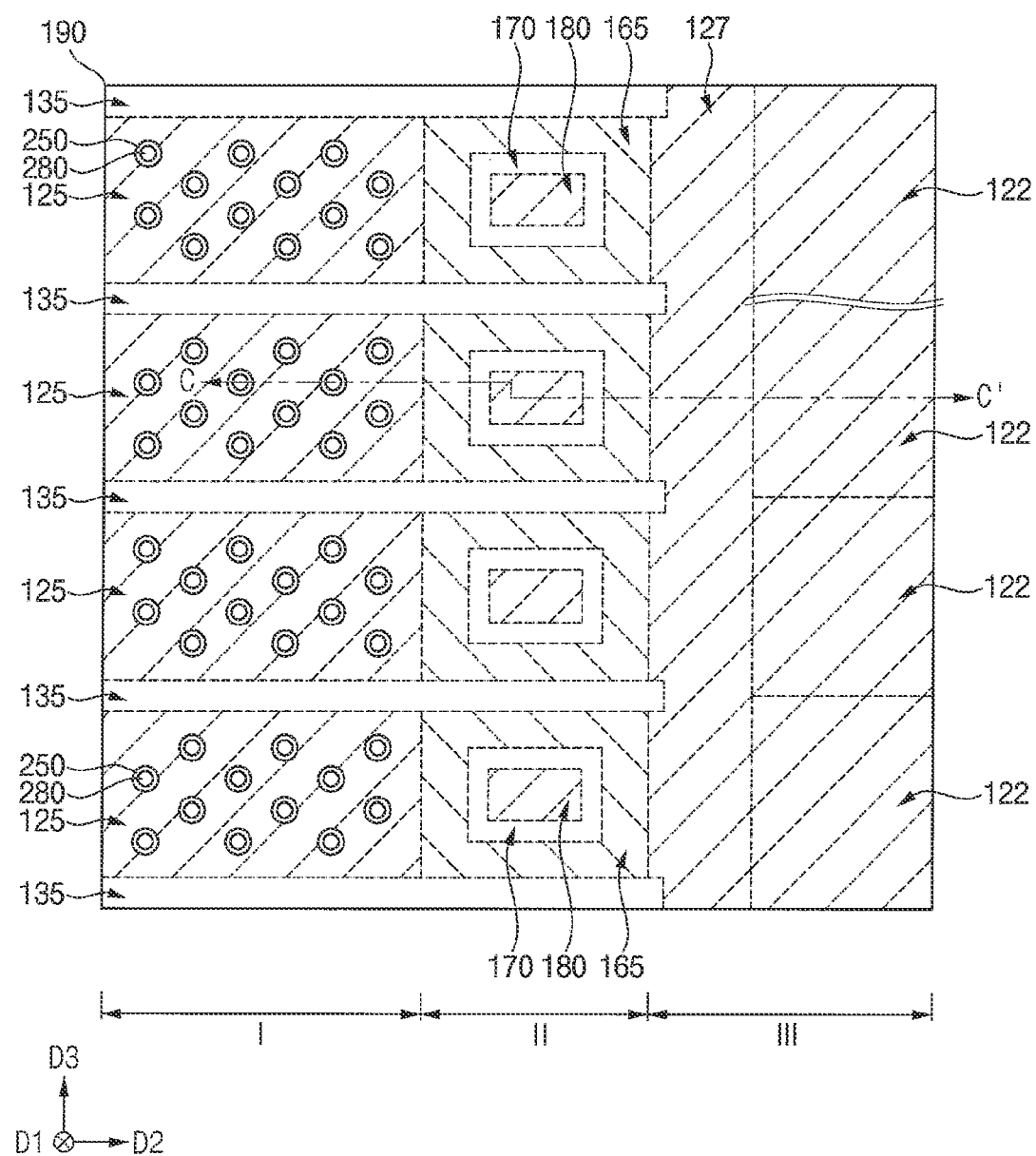
Figure 26:
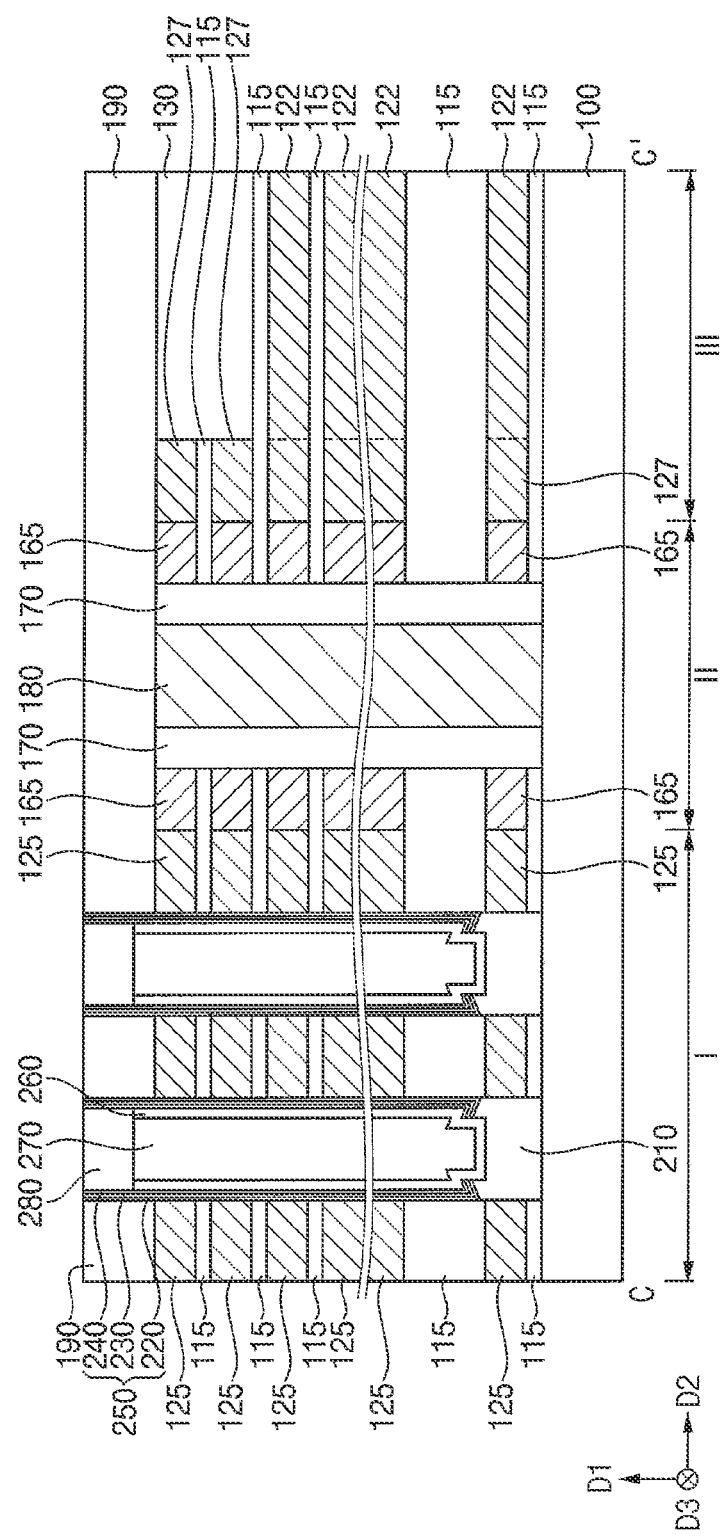
Figure 27:
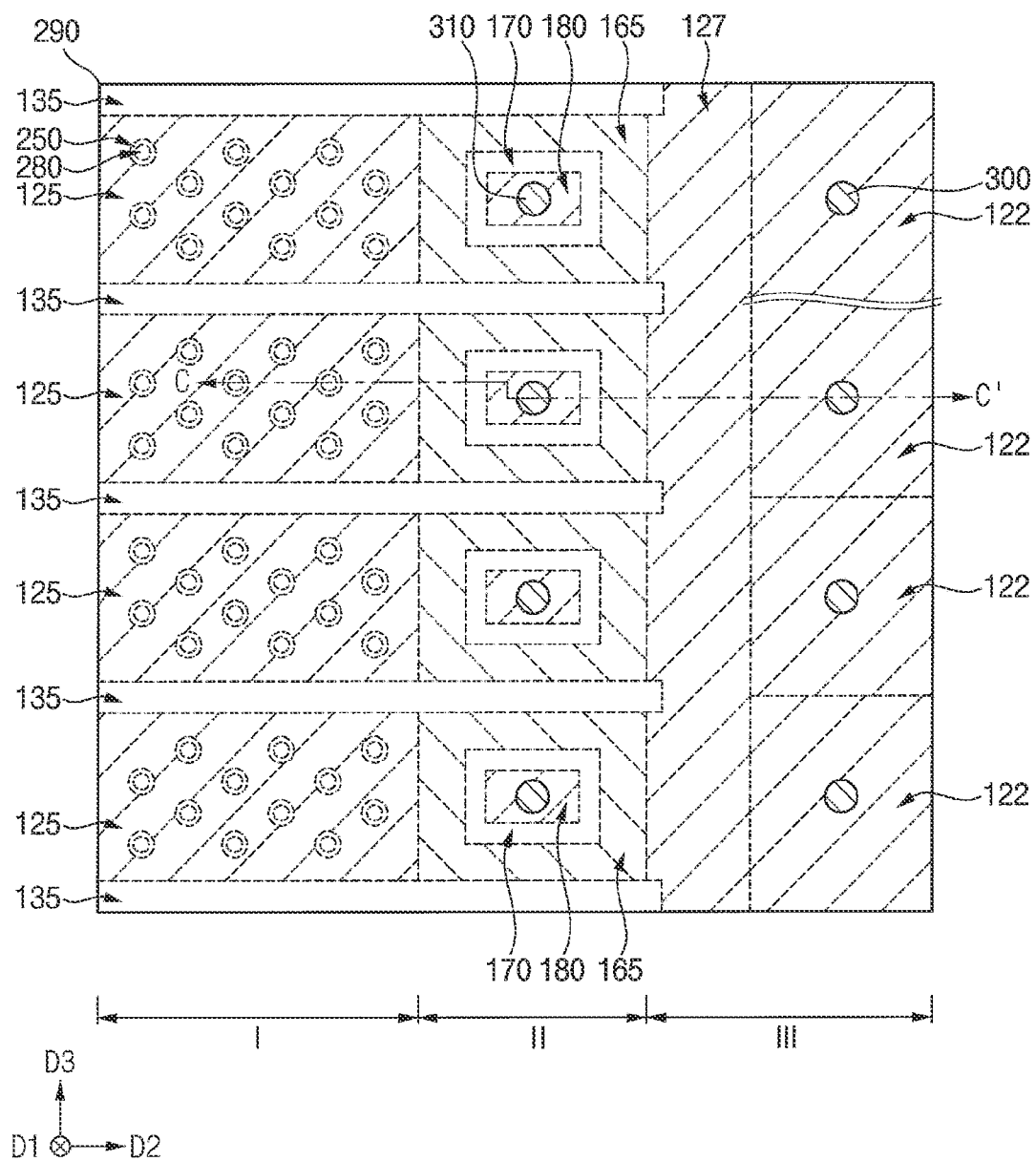
Figure 28:
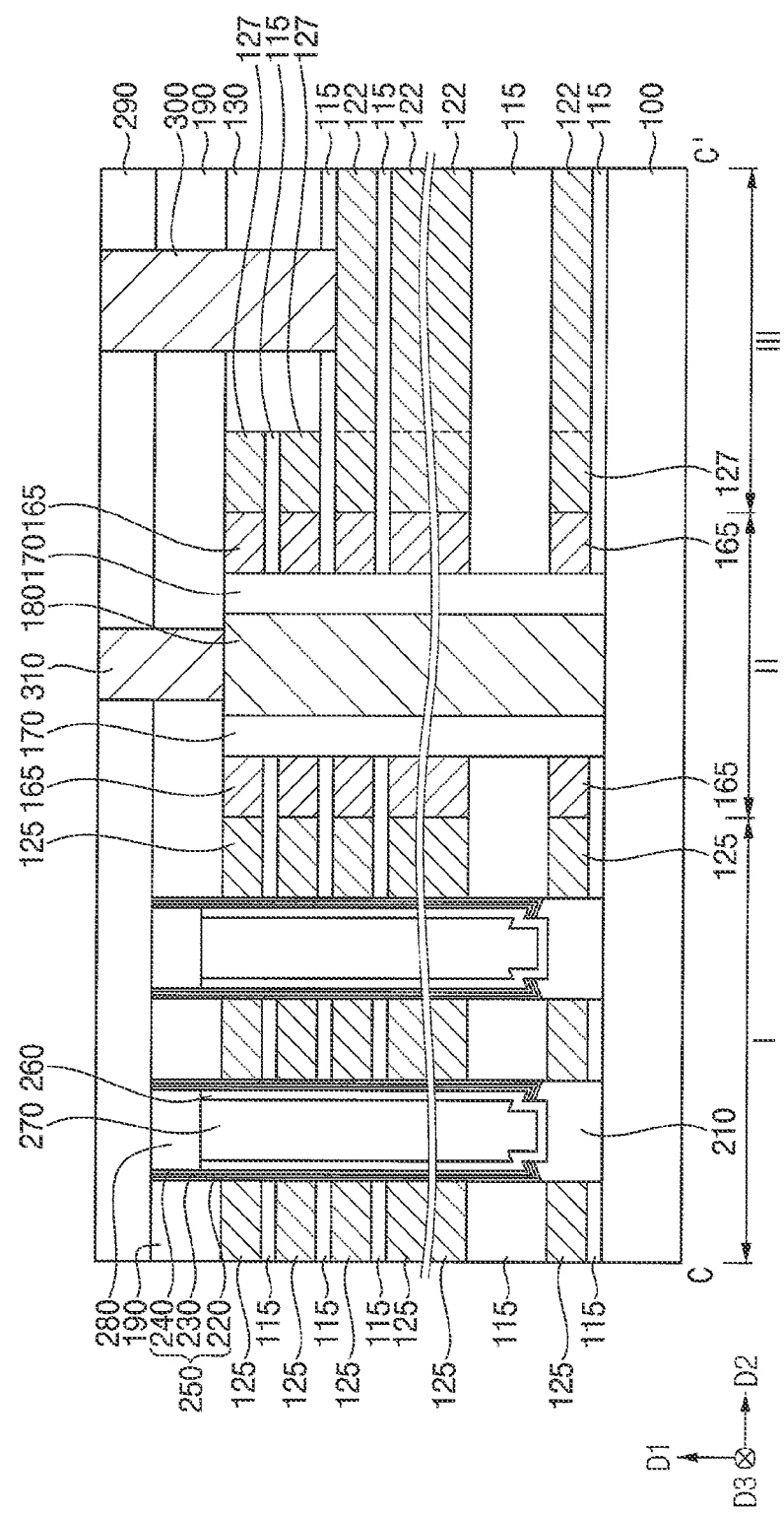

FIGS. 7, 9 and 11 are cross-sectional views taken along lines A-A' of corresponding plan views, respectively, FIGS. 13, 15, 16, 18, 20 and 22 are cross-sectional views taken along lines B-B' of corresponding plan views, respectively, and FIGS. 24, 26 and 28 are cross-sectional views taken along lines C-C' of corresponding plan views, respectively. FIGS. 6 to 28 are drawings of region X of FIG. 1.

Referring to FIGS. 6 and 7, insulation layer 110 and the first gate electrode layer 120 are alternately and repeatedly stacked on a first substrate 100 to form a mold layer.

The insulation layer 110 and the first gate electrode layer 120 may be formed by a deposition process, e.g., a chemical vapor deposition (CVD) process, an atomic layer deposition (ALD) process, etc. In an example embodiment, the first gate electrode layer 120 includes silicon or polysilicon doped with impurities having a first conductivity type.

Hereinafter, one of the first gate electrode layers 120 and one of the insulation layers 110 directly disposed thereon may be defined as a step layer. For example, some of the upper stacked layers may have a same width and be less than a width of others of the stacked layers below these upper stacked to form a step shape. The mold layer may include a plurality of step layers stacked in the first direction D1. In the mold layer, no insulation layer 110 is formed on an uppermost one of the first gate electrode layers 120.

Referring to FIGS. 8 and 9, for example, a portion of the mold layer on the third region III of the first substrate 100 may be partially removed by a dry etching process using, e.g., a photoresist pattern. For example, the partial removal may result in the step shape.

In an example embodiment, amounts of removal of the portions of the mold layer on the third region III of the first substrate 100 by the dry etching process may increase from a lowermost level toward an uppermost level, and thus remaining portions of the mold layer on the third region III of the first substrate 100 after the dry etching process may decrease from the lowermost level toward the uppermost level.

Thus, the portion of the mold layer on the third region III of the first substrate 100 may have a shape of a staircase including a plurality of steps arranged in the third direction D3. A portion of the first gate electrode layer 120 in each of the step layers that is not overlapped by upper ones of the step layers in the first direction D1, that is, the portion of the first gate electrode layer 120 in each step may be referred to as a pad 122.

In an example embodiment, a portion of the mold layer at a lowermost level on the third region III of the first substrate 100, that is, a lowermost one of the first gate electrode layers 120 is not partially removed. For example, the dry etching process may not cause removal of any portion of the lowermost first gate electrode layer 120.

In an example embodiment, the steps are not formed at an entire portion of the mold layer on the third region III of the first substrate 100, and the steps are not formed at a portion of the mold layer on a portion of the third region III adjacent to the second region II of the first substrate 100.

Referring to FIGS. 10 and 11, a first insulating interlayer may be formed on the first substrate 100 to cover the mold layer, and may be planarized until an upper surface of the mold layer is exposed, so that a first insulating interlayer pattern 130 may be formed to cover the steps of the mold layer.

The planarization process may include a chemical mechanical polishing (CMP) process and/or an etch back process.

A portion of the mold layer on the first and second regions I and II of the first substrate 100 may be removed to form a first opening exposing an upper surface of the first substrate 100.

In an example embodiment, the first opening extends in the second direction D2, and a plurality of first openings are spaced apart from each other in the third direction D3. In an example embodiment, the first opening extends to a portion of the third region III adjacent to the second region II of the first substrate 100, but does not extend to the steps, that is, the pads 122.

As the first openings are formed, a portion of the first gate electrode layer 120 disposed on the first and second regions I and II of the first substrate 100 may be divided into a plurality of first gate electrodes 125, where each the first gate electrodes 125 may extend in the second direction D2, spaced apart from each other in the third direction D3.

A portion of the first gate electrode layer 120 remaining on the third region III of the first substrate 100 may be referred to as a gate electrode connection portion 127. In an example embodiment, the gate electrode connection portion 127 extends in the third direction D3, and commonly contacts the first gate electrodes 125 disposed in the third direction D3 so as to be electrically connected to the first gate electrodes 125.

As the first openings are formed, the insulation layer 110 included in the mold layer may be transformed into an insulation pattern 115.

A first division pattern 135 may be formed in the first opening. The first division pattern 135 may be formed by forming a first division layer on the mold layer and the first insulating interlayer pattern 130 to fill the first opening, and planarizing the first division layer until the upper surface of the mold layer is exposed.

Figure 12:
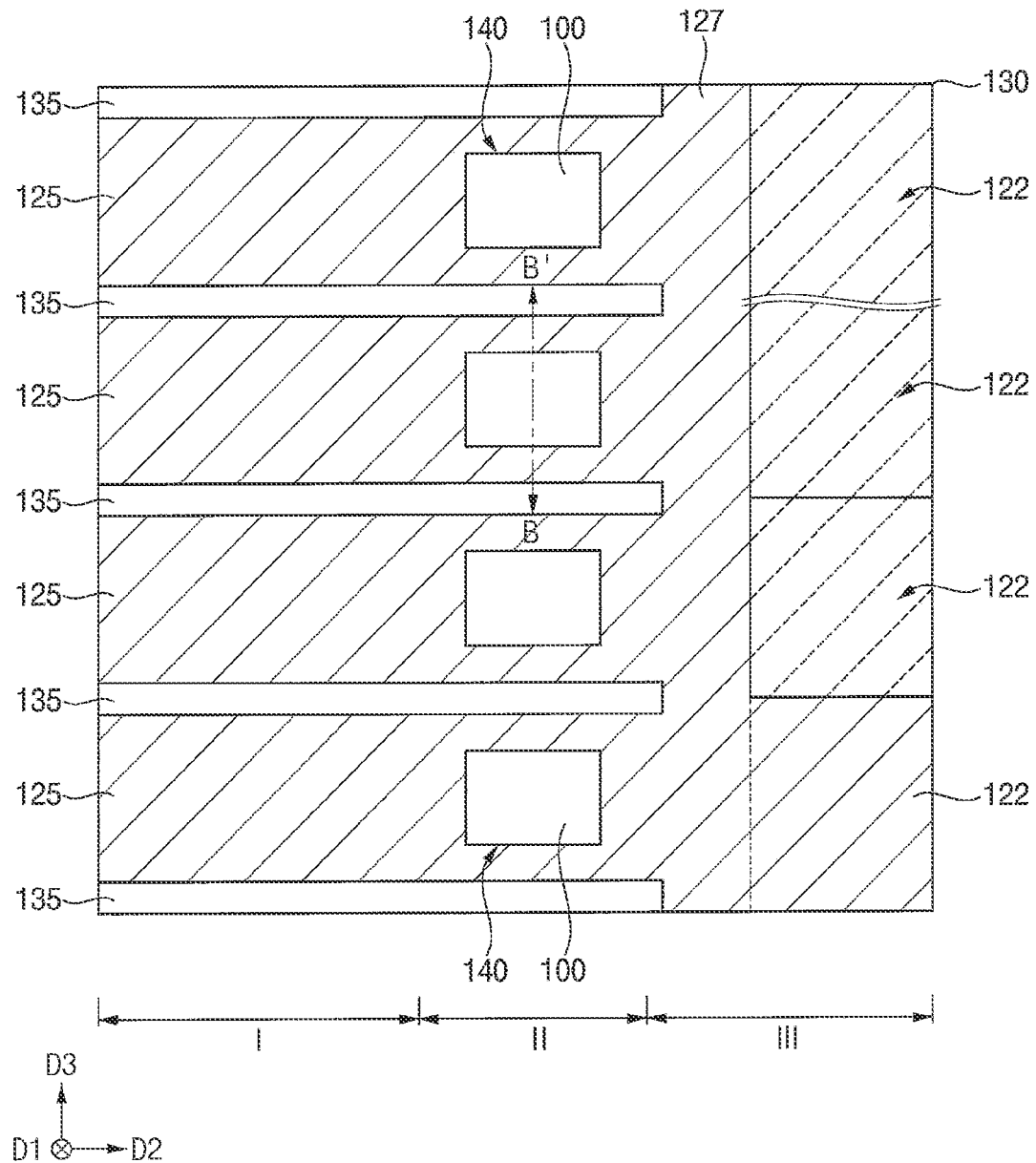
Figure 13:
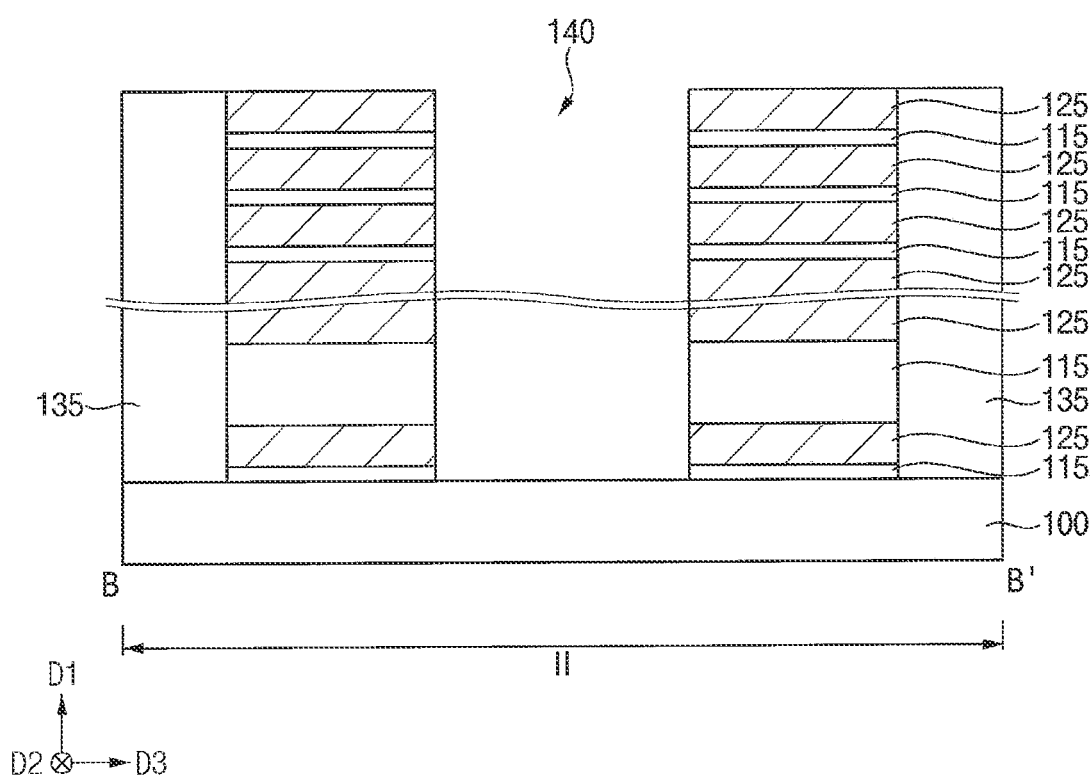

Referring to FIGS. 12 and 13, a portion of the mold layer on the second region II of the first substrate 100 may be partially removed to form a second opening 140 exposing the upper surface of the first substrate 100.

In an example embodiment, the second opening 140 is formed between ones of the first division patterns 135 neighboring in the third direction D3 on the second region II of the first substrate 100, and does not expose sidewalls of the first division patterns 135. For example, the second opening 140 may be formed between a pair of the first division patterns 135.

As the second opening 140 is formed, a sidewall of the first gate electrode 125 may be exposed.

Figure 14:
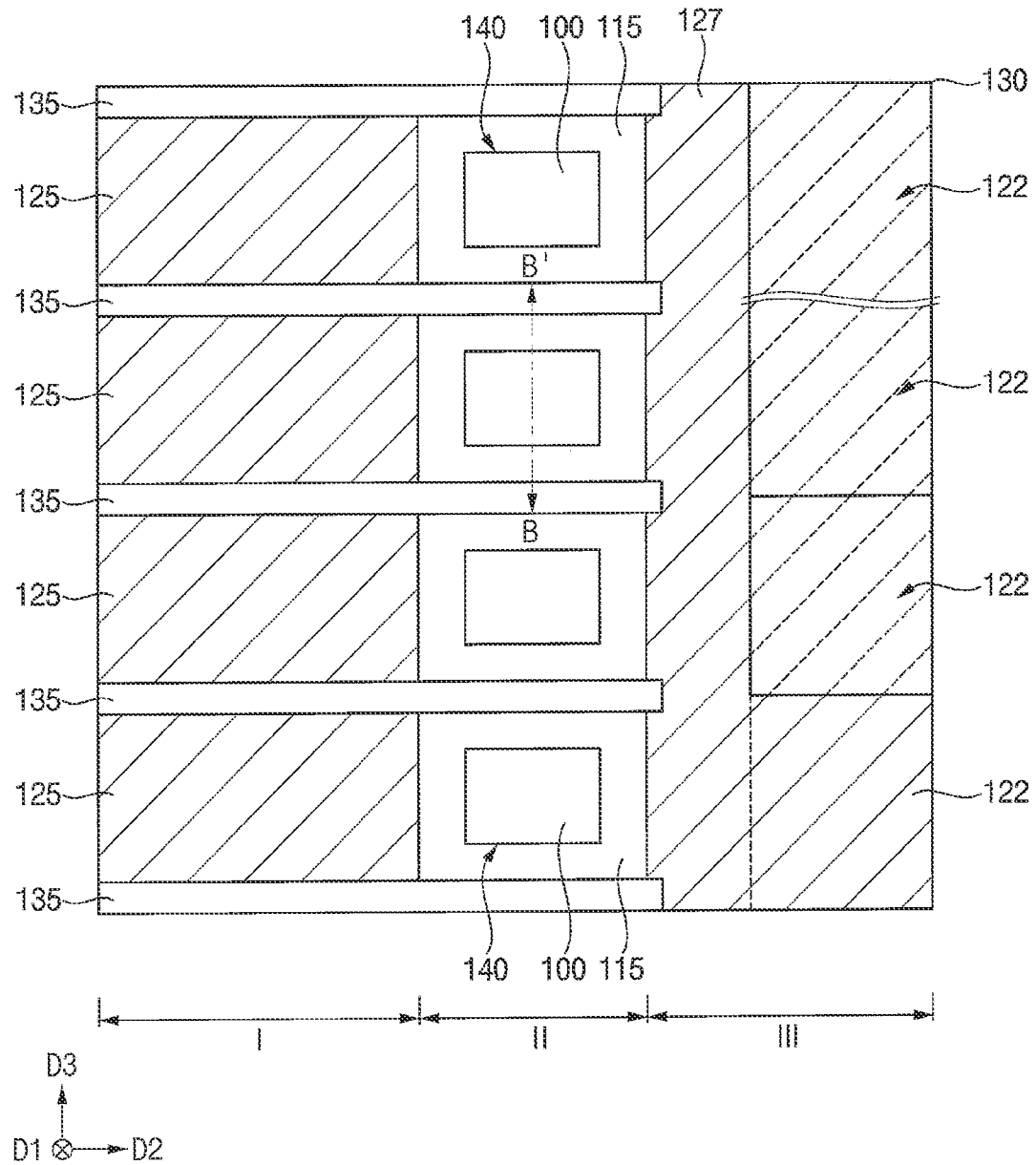
Figure 15:
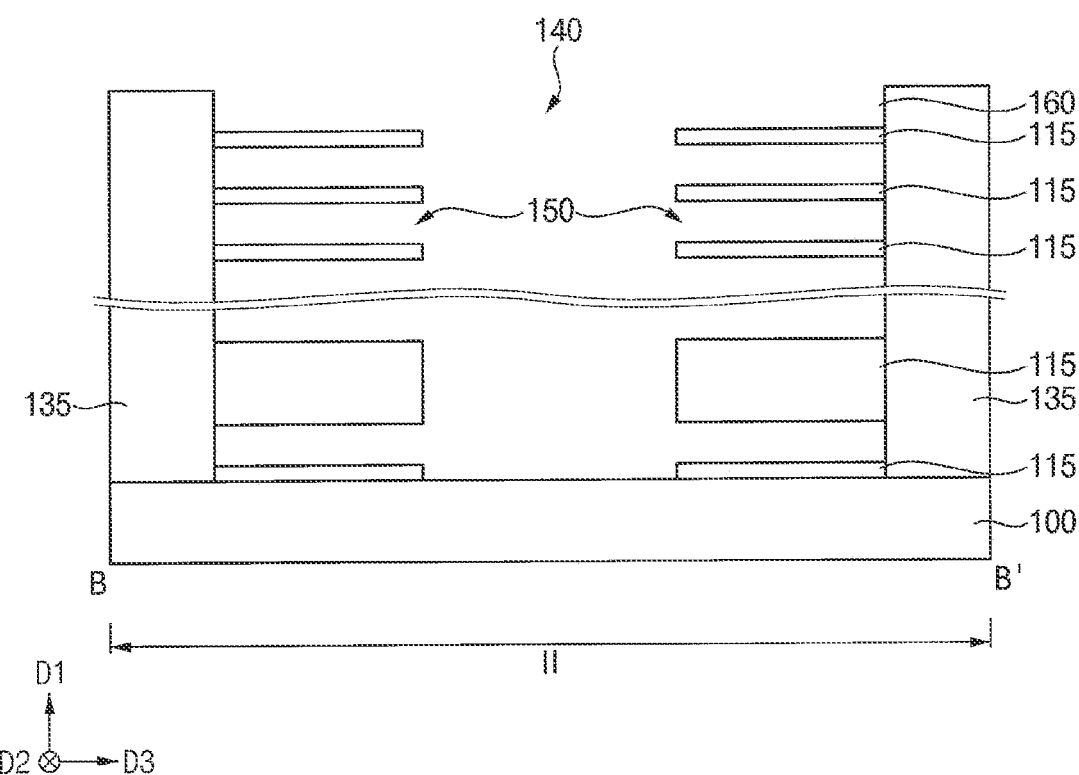

Referring to FIGS. 14 and 15, for example, a wet etching process may be performed to remove a portion of the first gate electrode 125 exposed by the second opening 140.

In an example embodiment, a portion of the first gate electrode 125 between ones of the first division patterns 135 neighboring in the third direction D3 on the second region II of the first substrate 100 may be removed by the wet etching process, so that a gap 150 exposing a sidewall of each of the first division patterns 135 is exposed.

By the wet etching process, the first gate electrode 125 may remain only on the first region I of the first substrate 100, and may be separated from the gate electrode connection portion 127 on the third region III of the first substrate 100.

Figure 16:
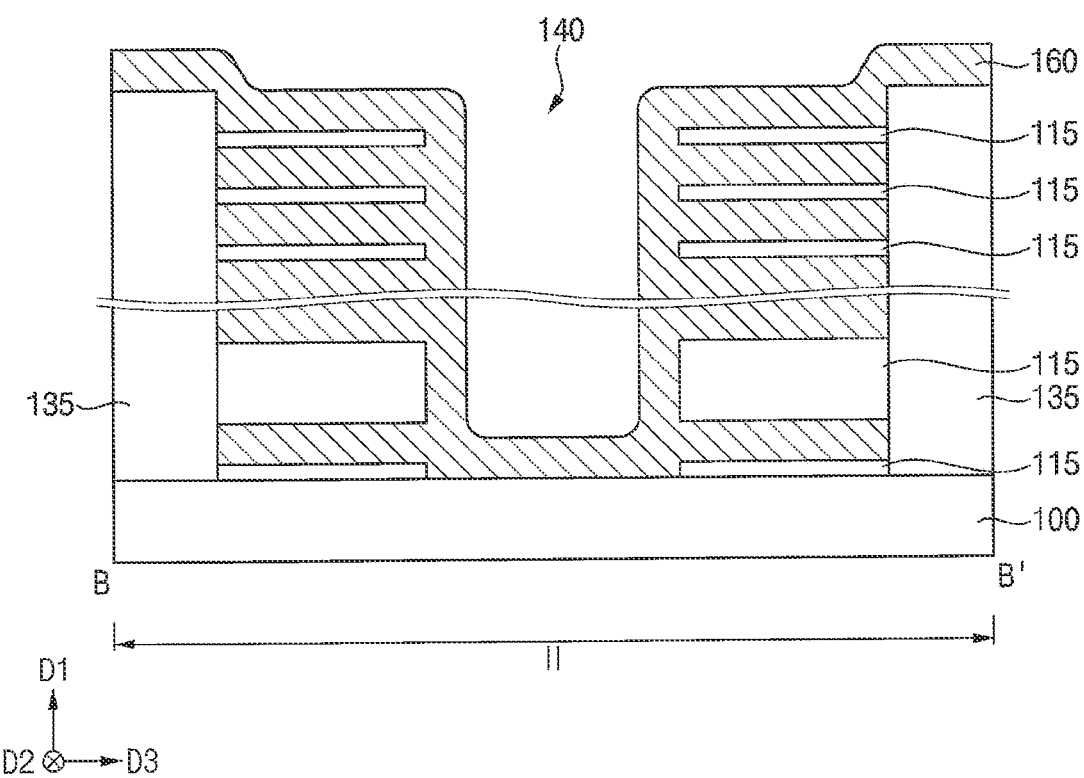

Referring to FIG. 16, a horizontal channel layer 160 may be formed on the first substrate 100 to fill the gap 150.

The horizontal channel layer 160 may be formed by a deposition process, e.g., a CVD process, an ALD process, etc., and may be formed on the mold layer, the first insulating interlayer pattern 130 and the first division pattern 135.

In an example embodiment, the horizontal channel layer 160 includes silicon or polysilicon doped with impurities having a second conductivity type that is opposite to the first conductivity type.

Figure 17:
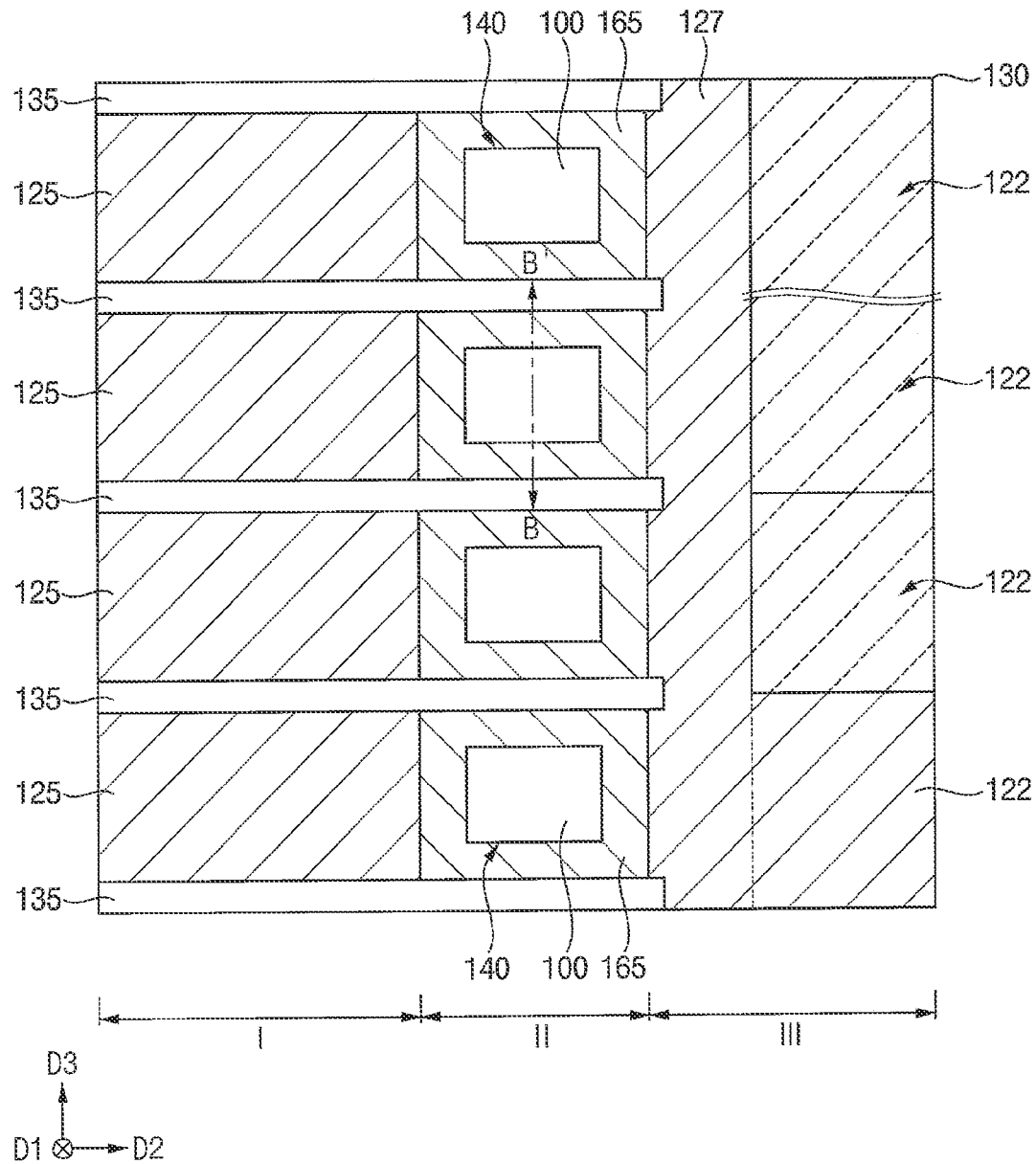
Figure 18:
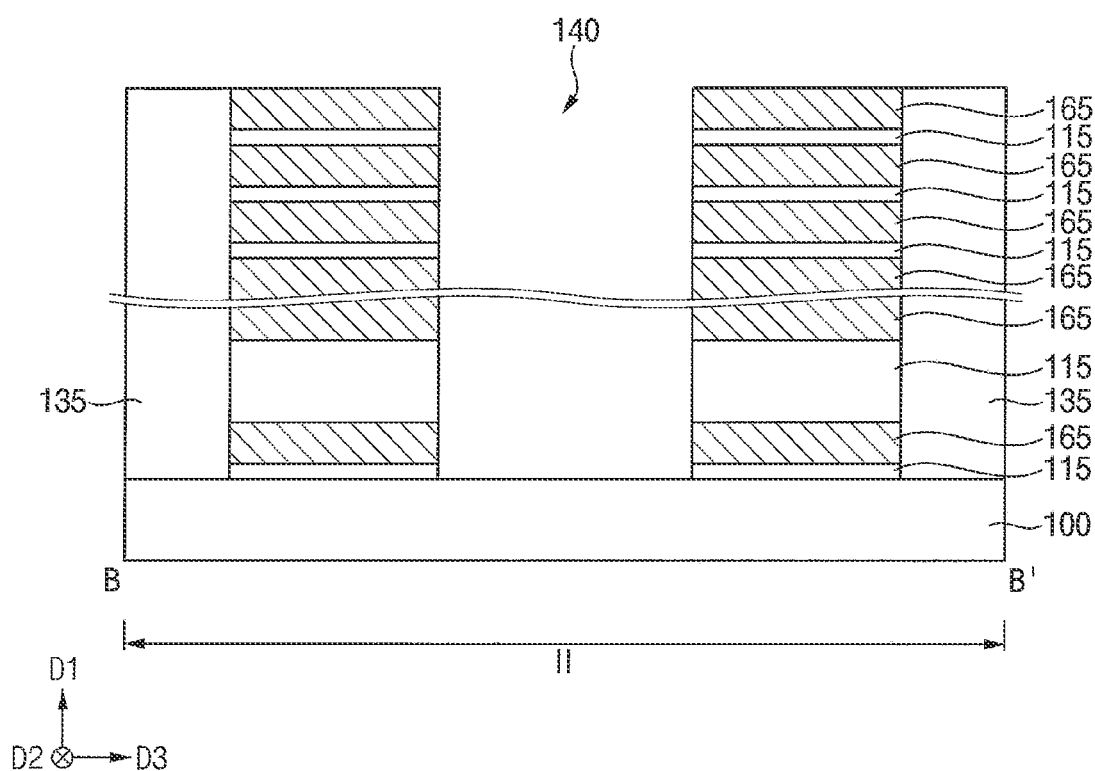

Referring to FIGS. 17 and 18, the horizontal channel layer 160 may be partially removed to form a horizontal channel 165 in each of the gaps 150.

In an example embodiment, a sacrificial layer is formed on the horizontal channel layer 160, and the sacrificial layer and the horizontal channel layer 160 is planarized until upper surfaces of the first insulating interlayer pattern 130 and the first division pattern 135 are exposed.

The sacrificial layer may include, e.g., spin-on-hardmask (SOH), amorphous carbon layer (ACL), etc., and may be removed later by, e.g., an ashing process and/or a stripping process.

A portion of the horizontal channel layer 160 in the second opening 140 may be removed by, e.g., a dry etching process.

Alternatively, the sacrificial layer is not formed, and the horizontal channel layer 160 is partially removed by, e.g., a wet etching process.

The horizontal channel 165 in each of the gaps 150 may be formed on the second region II of the first substrate 100, and may contact the first gate electrode 125 on the first region I of the first substrate 100 and the gate electrode connection portion 127 on the third region III of the first substrate 100. Thus, the first gate electrode 125 on the first region I of the first substrate 100 and the gate electrode connection portion 127 on the third region III of the first substrate 100 may be electrically connected to each other through the horizontal channel 165.

Hereinafter, the mold layer having the insulation pattern 115, the first gate electrode 125, the gate electrode connection portion 127 and the pad 122 therein and the horizontal channel 165 may be referred to as a mold.

Figure 19:
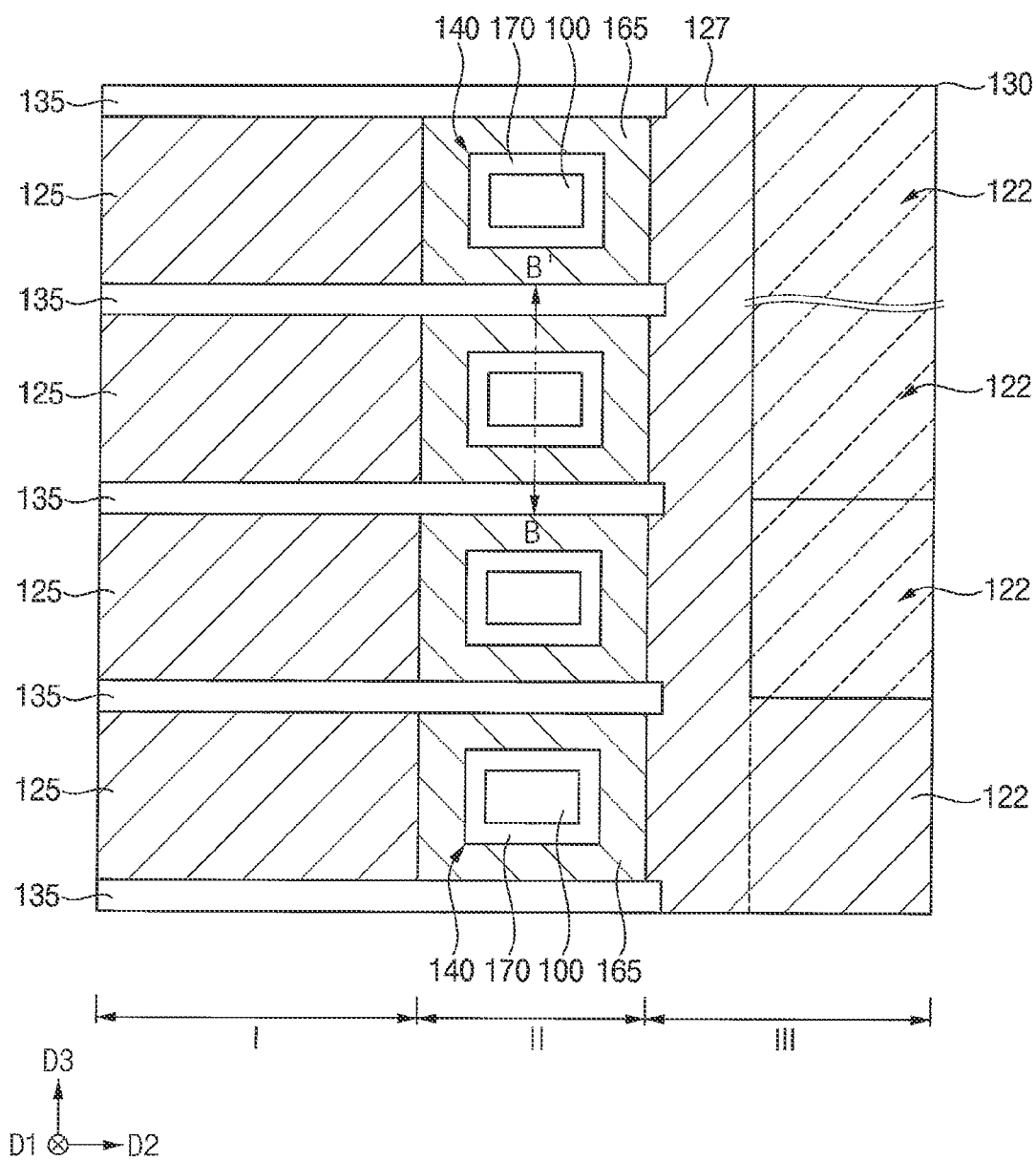
Figure 20:
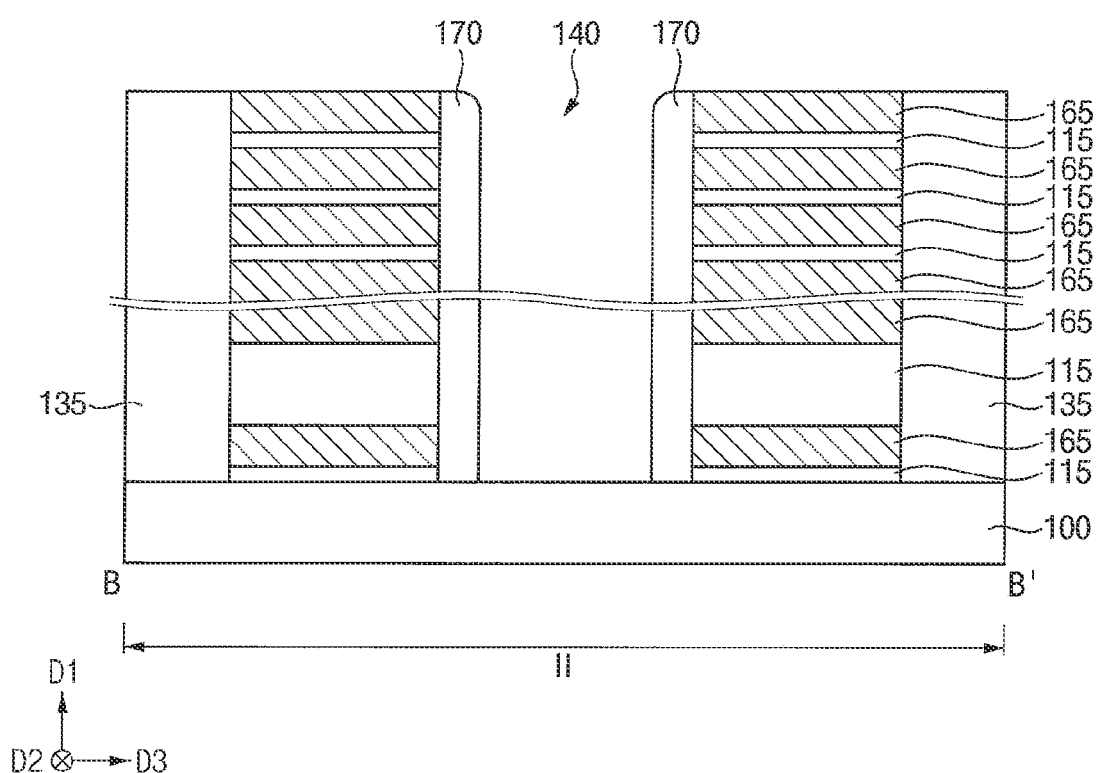

Referring to FIGS. 19 and 20, a gate insulation pattern 170 may be formed on a sidewall of the second opening 140.

In an example embodiment, the gate insulation pattern 170 is formed by forming a gate insulation layer on the first substrate 100 having the mold, the first insulating interlayer pattern 130 and the first division pattern 135 thereon, and performing an anisotropic etching process on the gate insulation layer.

Figure 21:
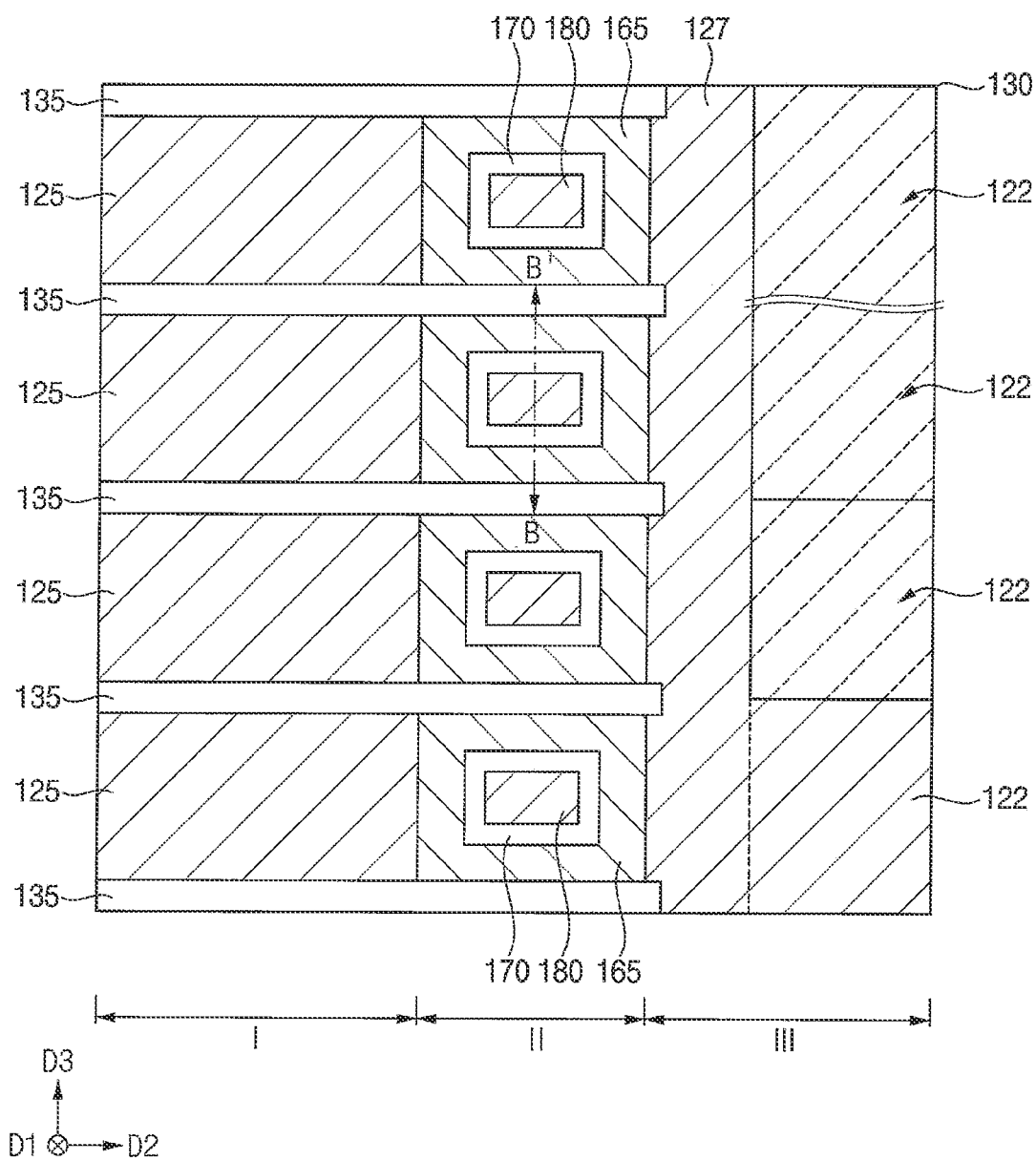
Figure 22:
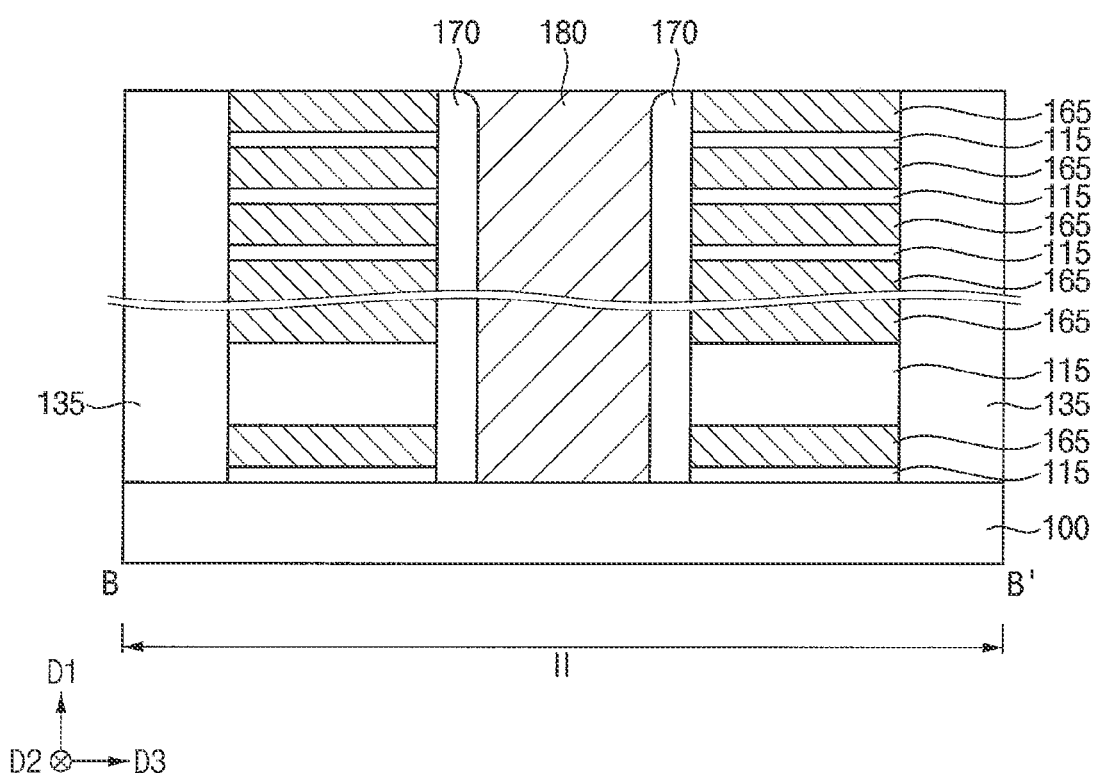

Referring to FIGS. 21 and 22, a second gate electrode 180 may be formed to fill a remaining portion of the second opening 140.

In an example embodiment, the second gate electrode 180 is formed by forming a second gate electrode layer on the first substrate 100 having the mold, the first insulating interlayer pattern 130, the first division pattern 135 and the gate insulation pattern 170, and performing a planarization process on the second gate electrode layer until upper surfaces of the mold, the first insulating interlayer pattern 130, the first division pattern 135 and the gate insulation pattern 170 are exposed.

In an example embodiment, the second gate electrode 180 extends in the first direction D1, and the second gate electrode 180 and the gate insulation pattern 170 may collectively form a vertical gate structure. The vertical gate structure may extend through the mold in the first direction D1.

Referring to FIGS. 23 and 24, a second insulating interlayer 190 may be formed on the first substrate 100 having the mold, the vertical gate structure, the first insulating interlayer pattern 130 and the first division pattern 135 thereon, and a third opening 200 may be formed through the second insulating interlayer 190, and the first gate electrodes 125 and the insulation patterns 115 included in the mold on the first region I of the first substrate 100 to expose the upper surface of the first substrate 100.

In an example embodiment, a plurality of third openings 200 are formed to be spaced apart from each other in the second and third directions D2 and D3 between ones of the first division patterns 135 neighboring in the third direction D3. For example, a third opening 200 may be formed between a pair of the first division patterns 135.

Referring to FIGS. 25 and 26, a memory channel structure may be formed in the third opening 200.

In an example embodiment, a semiconductor pattern 210 is formed on the upper surface of the first substrate 100 exposed by the third opening 200, a charge storage structure 250 is formed on an edge upper surface of the semiconductor pattern 210 and a sidewall of the third opening 200, a vertical channel 260 is formed on a central upper surface of the semiconductor pattern 210 and an inner sidewall of the charge storage structure 250, and a filling pattern 270 is formed on the vertical channel 260 to fill a remaining portion of the third opening 200.

In an example embodiment, the semiconductor pattern 210 is formed by a selective epitaxial growth (SEG) process using the upper surface of the first substrate 100 exposed by the third opening 200 as a seed.

The charge storage structure 250 may be formed by forming a charge storage structure layer on an upper surface of the semiconductor pattern 210, a sidewall of the third opening 200 and an upper surface of the second insulating interlayer 190, forming a sacrificial spacer layer on the charge storage layer, performing an anisotropic etching process on the sacrificial layer to form a sacrificial spacer in the third opening 200, and performing an etching process using the sacrificial spacer as an etching mask so as to be formed on the sidewall of the third opening 200 and the edge upper surface of the semiconductor pattern 210.

In an example embodiment, the charge storage structure 250 includes a blocking pattern 220, a charge storage pattern 230 and a tunnel insulation pattern 240 sequentially stacked in the horizontal direction from the sidewall of the third opening 200.

The sacrificial layer may include, e.g., silicon or polysilicon, and may be removed later.

The vertical channel 260 and the filling pattern 270 may be formed by forming a vertical channel layer on a central upper surface of the semiconductor pattern 210, an inner sidewall of the charge storage structure 250 and the upper surface of the second insulating interlayer 190, forming a filling layer on the vertical channel layer to fill a remaining portion of the third opening 200, and planarizing the filling layer and the vertical channel layer until the upper surface of the second insulating interlayer 190 is exposed.

Upper portions of the filling pattern 270 and the vertical channel 260 may be removed to form a recess, and a capping layer 280 may be formed in the recess.

The semiconductor pattern 210 and the vertical channel 260 in the third opening 200 may collectively form a vertical channel structure, and the vertical channel structure, the charge storage structure 250, the filling pattern 270 and the capping layer 280 may collectively form the memory channel structure.

In an example embodiment, the memory channel structure has a shape of a pillar extending in the first direction D1 through the mold on the first region I of the first substrate 100, and a plurality of memory channel structures are spaced apart from each other in the second and third directions D2 and D3 between ones of the first division patterns 135 neighboring in the third direction D3.

Referring to FIGS. 27 and 28, a third insulating interlayer 290 may be formed on the second insulating interlayer 190 and the memory channel structure, and a first contact plug 300 extending through the second and third insulating interlayers 190 and 290, the first insulating interlayer pattern 130 and the insulation pattern 115 to contact an upper surface of the pad 122 and a second contact plug 310 extending through the second and third insulating interlayers 190 and 290 to contact an upper surface of the second gate electrode 180 may be formed.

In an example embodiment, a plurality of first contact plugs 300 may be spaced apart from each other in the third direction D3, and may be formed on the pads 122, respectively, arranged in the third direction D3 on the third region III of the first substrate 100. Additionally, a plurality of second contact plugs 310 may be spaced apart from each other in the third direction D3, and may be formed on the second gate electrodes 180 arranged in the third direction D3 on the second region II of the first substrate 100.

Referring back to FIGS. 1 to 5, a fourth insulating interlayer 320 may be formed on the third insulating interlayer 290 and the first and second contact plugs 300 and 310, and first and second wirings 330 and 340 extending through the fourth insulating interlayer 320 to contact upper surfaces of the first and second contact plugs 300 and 310, respectively, and a first via 350 extending through the third and fourth insulating interlayers 290 and 320 to contact an upper surface of the capping layer 280 may be formed.

In an example embodiment, the first wiring 330 extends in the third direction D3 on the third region III of the first substrate 100.

A fifth insulating interlayer 360 may be formed on the fourth insulating interlayer 320, the first and second wirings 330 and 340, and the first via 350, and a second via 370 extending through the fifth insulating interlayer 360 to contact an upper surface of the second wiring 340, and a third wiring 380 and a fourth wiring extending through the fifth insulating interlayer 360 to contact upper surfaces of the first vias 350 may be formed.

In an example embodiment, the third wiring 380 and the fourth wiring extend in the third direction D3 to a given length to contact some of the first vias 350. For example, the fourth wiring may contact two of the first vias 350 that are relatively close to each of the first division patterns 135 in the third direction D3, and the third wiring 380 may contact two of the first vias 350 that are relatively far from each of the first division patterns 135 in the third direction D3.

A sixth insulating interlayer 390 may be formed on the fifth insulating interlayer 360, the second via 370, the third wiring 380 and the fourth wiring, and a fifth wiring 400 extending through the sixth insulating interlayer 390 to contact an upper surface of the second via 370 and a sixth wiring 410 extending through the sixth insulating interlayer 390 to contact an upper surface of each of the third wiring 380 and the fourth wiring may be formed.

In an example embodiment, the fifth wiring 400 extends in the second direction D2 on the second and third regions II and III of the first substrate 100.

In an example embodiment, the sixth wiring 410 extends in the third direction D3 on the first region I of the first substrate 100, and a plurality of sixth wirings 410 are spaced apart from each other in the second direction D2. Each of the sixth wirings 410 may commonly contact a plurality of third wirings 380 disposed in the third direction D3, or may commonly contact a plurality of fourth wirings disposed in the third direction D3.

A semiconductor device may be manufactured by the above processes.

As illustrated above, the second opening 140 may be formed through the mold layer, the portion of the first gate electrode 125 adjacent to the second opening 140 to form the gap 150, the horizontal channel 165 may be formed to fill the gap 150, and the vertical gate structure may be formed to fill the remaining portion of the second opening 140. Thus, the block selection transistor including the vertical gate structure and the horizontal channel 165 may be easily formed.

Figure 29:
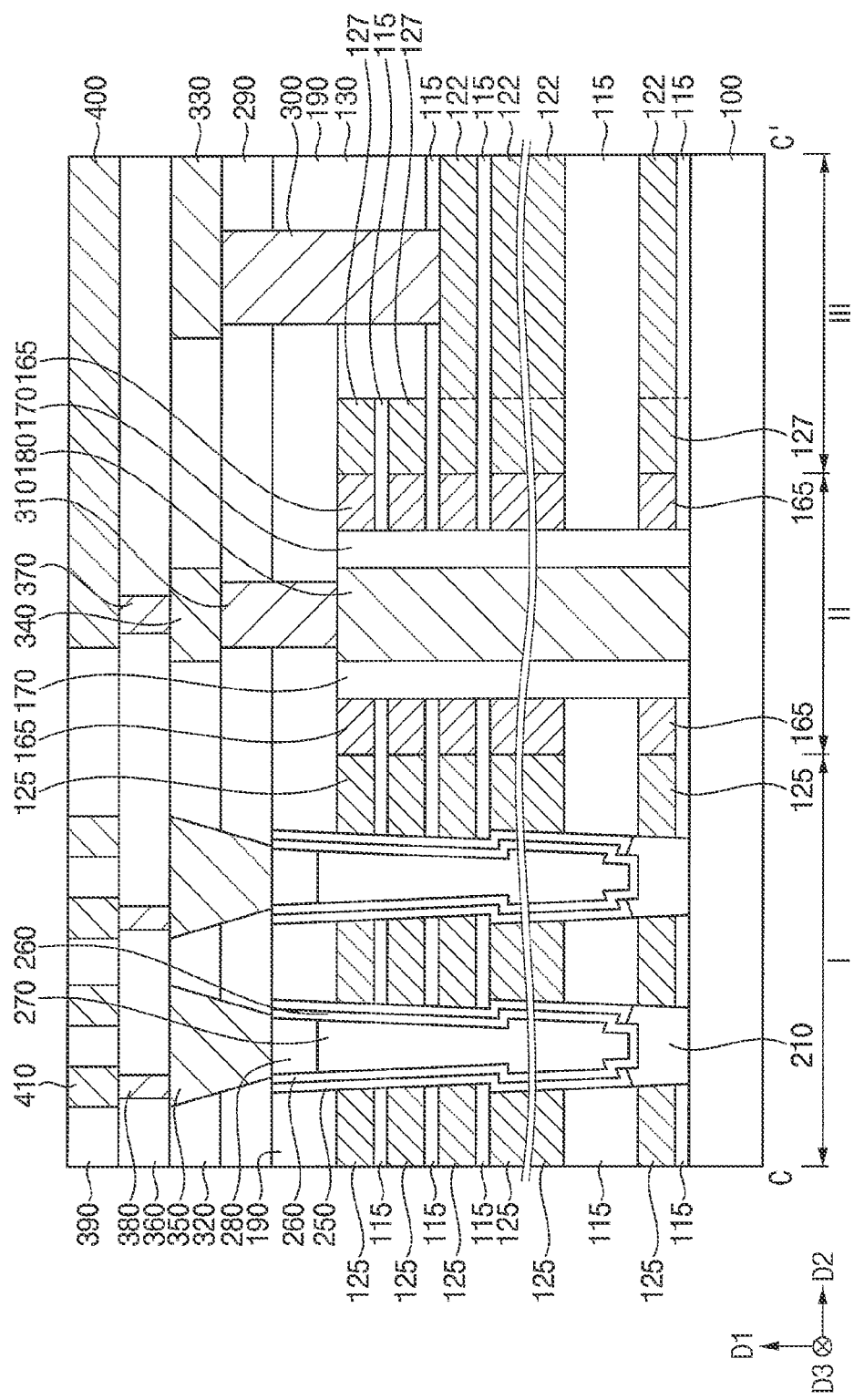
FIGS. 29 and 30 are cross-sectional views illustrating semiconductor devices in accordance with an example embodiment.
Figure 30:
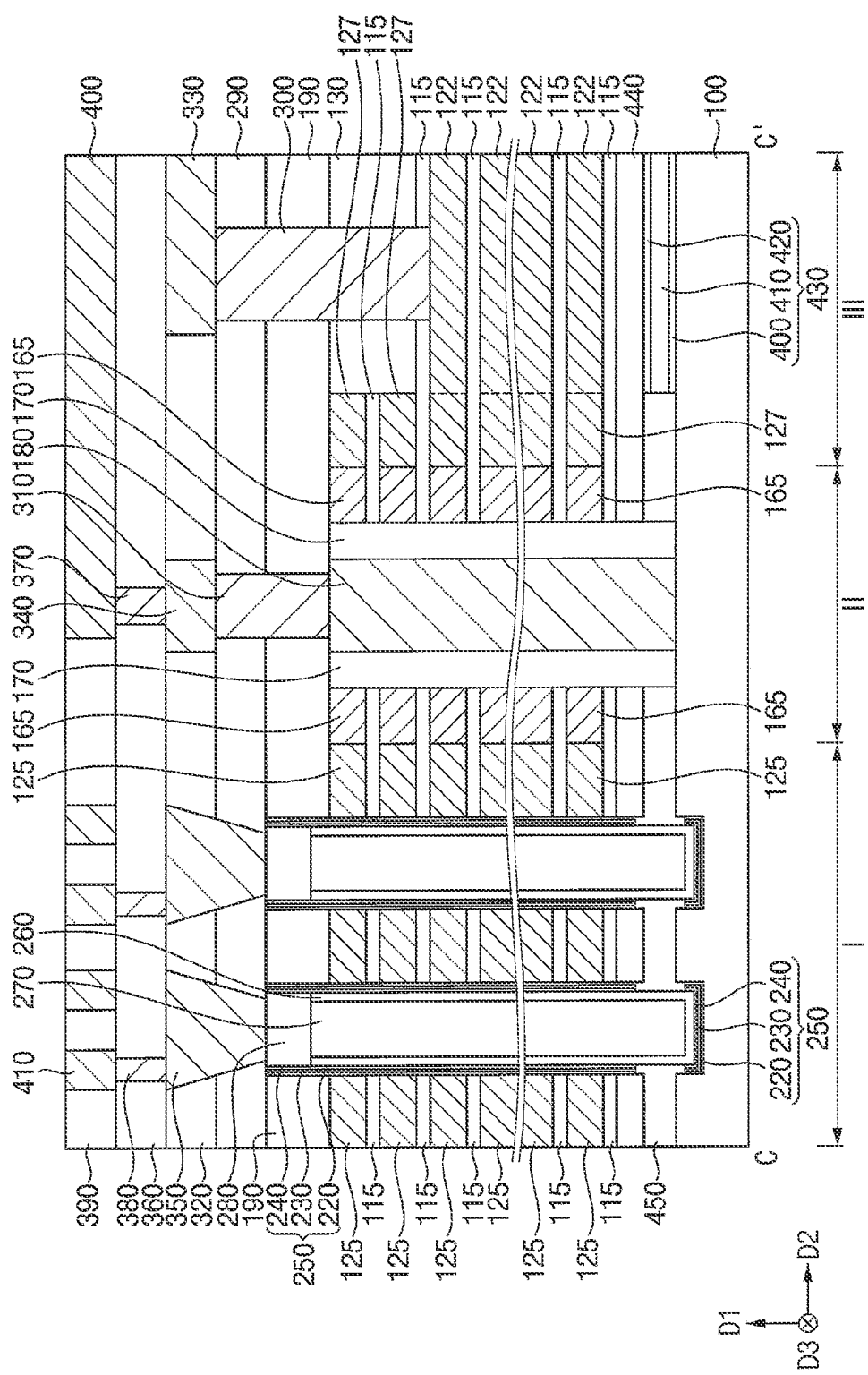

FIGS. 29 and 30 are cross-sectional views illustrating semiconductor devices in accordance with example embodiments, which correspond to FIG. 5. Each of the semiconductor devices may be substantially the same as or similar to that of FIGS. 1 to 5, except for some elements, and thus repeated explanations thereof are omitted herein.

Referring to FIG. 29, the memory channel structure included in the semiconductor device may include a plurality of portions sequentially stacked in the first direction D1, and each of the portions may have a horizontal width gradually increasing from a bottom toward a top thereof.

FIG. 29 shows that the memory channel structure includes two portions stacked in the first direction D1, however, the inventive concept is not limited thereto. For example, the memory channel structure may include more than two portions sequentially stacked. In an example embodiment, the charge storage structures 250 included in the respective portions of the memory channel structure are connected to each other, and the vertical channels 260 included in the respective portions of the memory channel structure are connected to each other.

Referring to FIG. 30, the memory channel structure included in the semiconductor device does not include the semiconductor pattern 210, and thus the vertical channel 260 may directly contact the upper surface of the first substrate 100.

A channel connection pattern 450 and a support layer 440 may be stacked on the first and second regions I and II of the first substrate 100, and the mold may be formed on the support layer 440. Each of the channel connection pattern 450 and the support layer 440 may include, e.g., silicon or polysilicon doped with n-type impurities or undoped polysilicon.

A sacrificial pattern structure 430 may be formed on the third region III of the first substrate 100, and the mold may be formed on the support layer 440. The sacrificial pattern structure 430 may include first, second and third sacrificial patterns 400, 410 and 420 sequentially stacked in the first direction D1, which may include, e.g., silicon oxide, silicon nitride and silicon nitride, respectively.

In an example embodiment, the charge storage structure 250 includes an upper portion disposed on an outer sidewall of the vertical channel 260 and a lower portion disposed on the upper surface of the first substrate 100 and on a lower surface of the vertical channel 260. Thus, the channel connection pattern 450 may commonly contact ones of the vertical channels 260 in the same block among the vertical channels 260 on the first region I of the first substrate 100.

Figure 31:
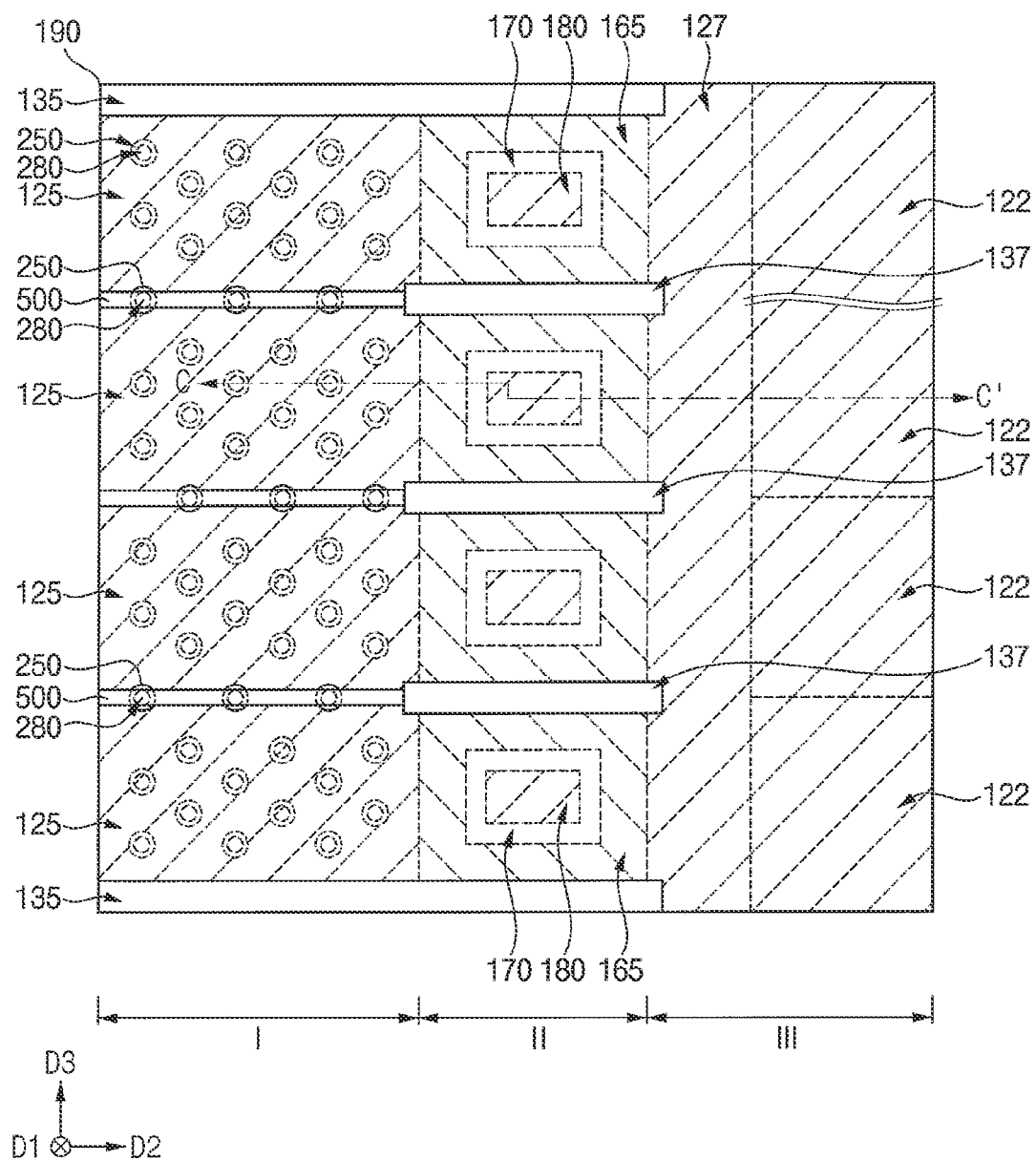
FIG. 31 is a cross-sectional view illustrating a semiconductor device in accordance with an example embodiment.

FIG. 31 is a cross-sectional view illustrating a semiconductor device in accordance with an example embodiment, which corresponds to FIG. 5. The semiconductor device may be substantially the same as or similar to that of FIGS. 1 to 5, except for some elements, and thus repeated explanations thereof are omitted herein.

Referring to FIG. 31, a second division pattern 137 may be further formed between ones of the first division patterns 135 neighboring in the third direction D3 on the first and second regions I and II of the first substrate 100.

In an example embodiment, the second division pattern 137 extends in the second direction D2 on the second region II of the first substrate 100, and is also formed on a portion of the first and third regions I and III of the first substrate 100 adjacent to the second region II of the first substrate 100 in the second direction D2. Like the first division pattern 135, the second division pattern 135 may extend through the mold to contact the upper surface of the first substrate 100.

In an example embodiment, one or a plurality of second division patterns 137 may be formed between the first division patterns 135, and FIG. 31 shows three second division patterns 137, however, the inventive concept is not limited thereto.

In an example embodiment, a third division pattern 500 extending in the second direction D2 to be connected to the second division pattern 137 is further formed on the first region I of the first substrate 100. Since one or a plurality of second division patterns 137 is formed between the first division patterns 135, one or a plurality of third division patterns 500 may be formed between the first division patterns 135.

In an example embodiment, unlike the first and second division patterns 135 and 137, the third division pattern 500 does not extend through the mold to contact the upper surface of the first substrate 100, but extends only through an upper portion of the mold. For example, the third division pattern 500 may be formed at a level where ones of the first gate electrodes 125 serving as the SSL are formed. Thus, the SSLs in each of the blocks may be divided in the third direction D3 by the third division pattern 500. In this case, each block may include one GSL and one word line at each level, but may include a plurality of SSLs at each level.

Figure 32:
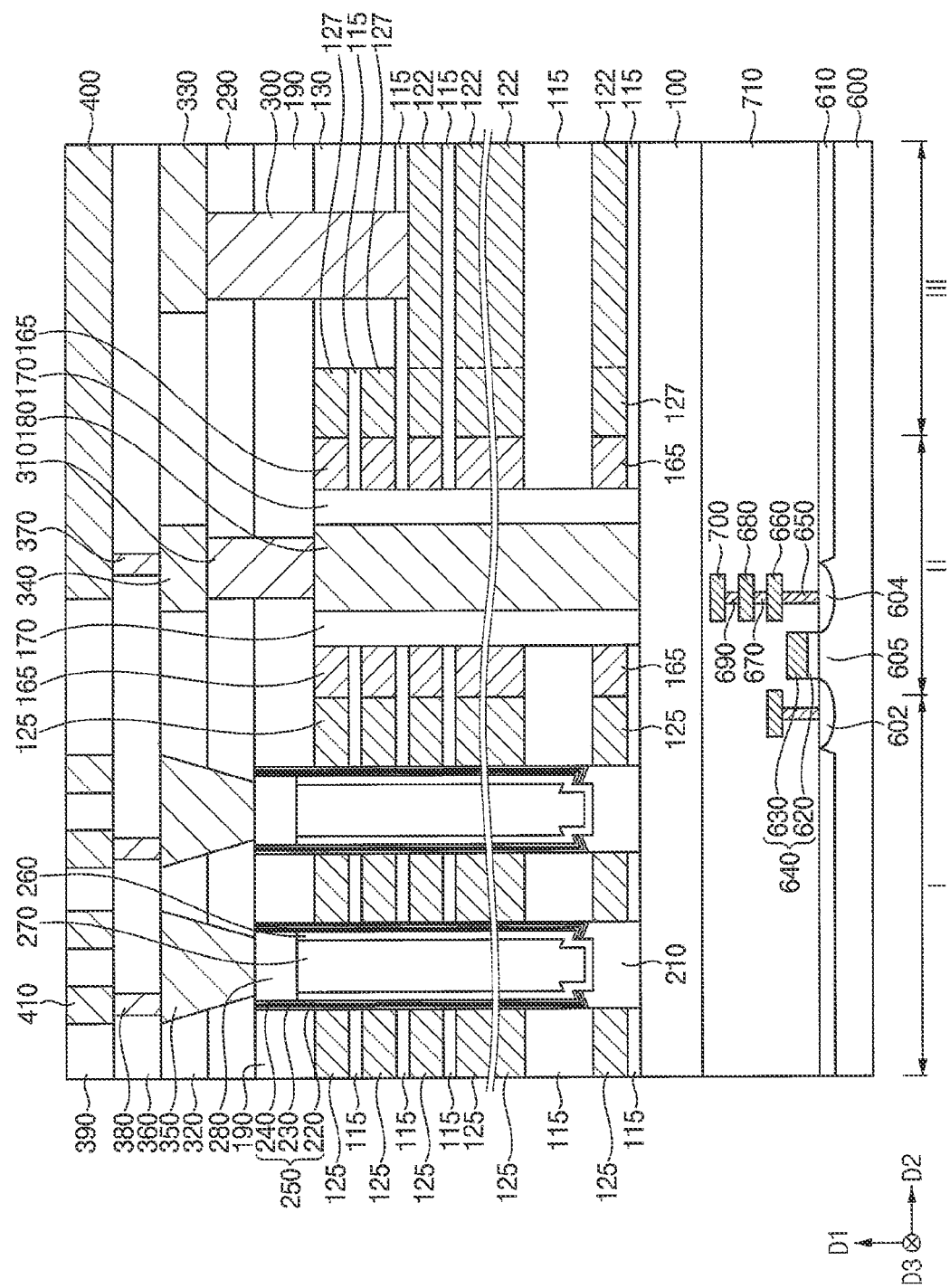
FIG. 32 is a cross-sectional view illustrating a semiconductor device in accordance with an example embodiment.

FIG. 32 is a cross-sectional view illustrating a semiconductor device in accordance with an example embodiment, which corresponds to FIG. 5. The semiconductor device may be substantially the same as or similar to that of FIGS. 1 to 5, except for some elements, and thus repeated explanations thereof are omitted herein.

Referring to FIG. 32, the semiconductor device may have a cell over periphery (COP) structure.

That is, a second substrate 600 and a lower circuit pattern may be further formed under the semiconductor device shown in FIGS. 1 to 5, and the lower circuit pattern may include, e.g., lower transistors, lower contact plugs, lower vias and lower wirings, etc.

An isolation pattern 610 may be formed on the second substrate 600, and an active region 605 may be defined on a portion of the second substrate 600 on which no isolation pattern is formed.

FIG. 32 shows a lower transistor including a lower gate structure 640 and first and second impurity regions 602 and 604 at upper portions, respectively, of the active region 605 adjacent to the lower gate structure 640, which may serve as source/drain regions. The lower gate structure 640 may include a lower gate insulation pattern 620 and a lower gate electrode 630 stacked on the second substrate 600.

FIG. 32 shows that a lower contact plug 650 and a first lower wiring 660 are stacked on the first and second impurity regions 602 and 604, and a first lower via 670, a second lower wiring 680, a second lower via 690 and a third lower wiring 700 are sequentially stacked on the first lower wiring 660.

A first lower insulating interlayer 710 covering the lower circuit pattern may be formed on the second substrate 600, and may contact the first substrate 100.

The lower circuit pattern may extend in the first direction D1, and may be electrically connected to the memory cell or an upper circuit pattern on the first substrate 100 via a through electrode (not shown) extending through the first substrate 100.

Figure 33:
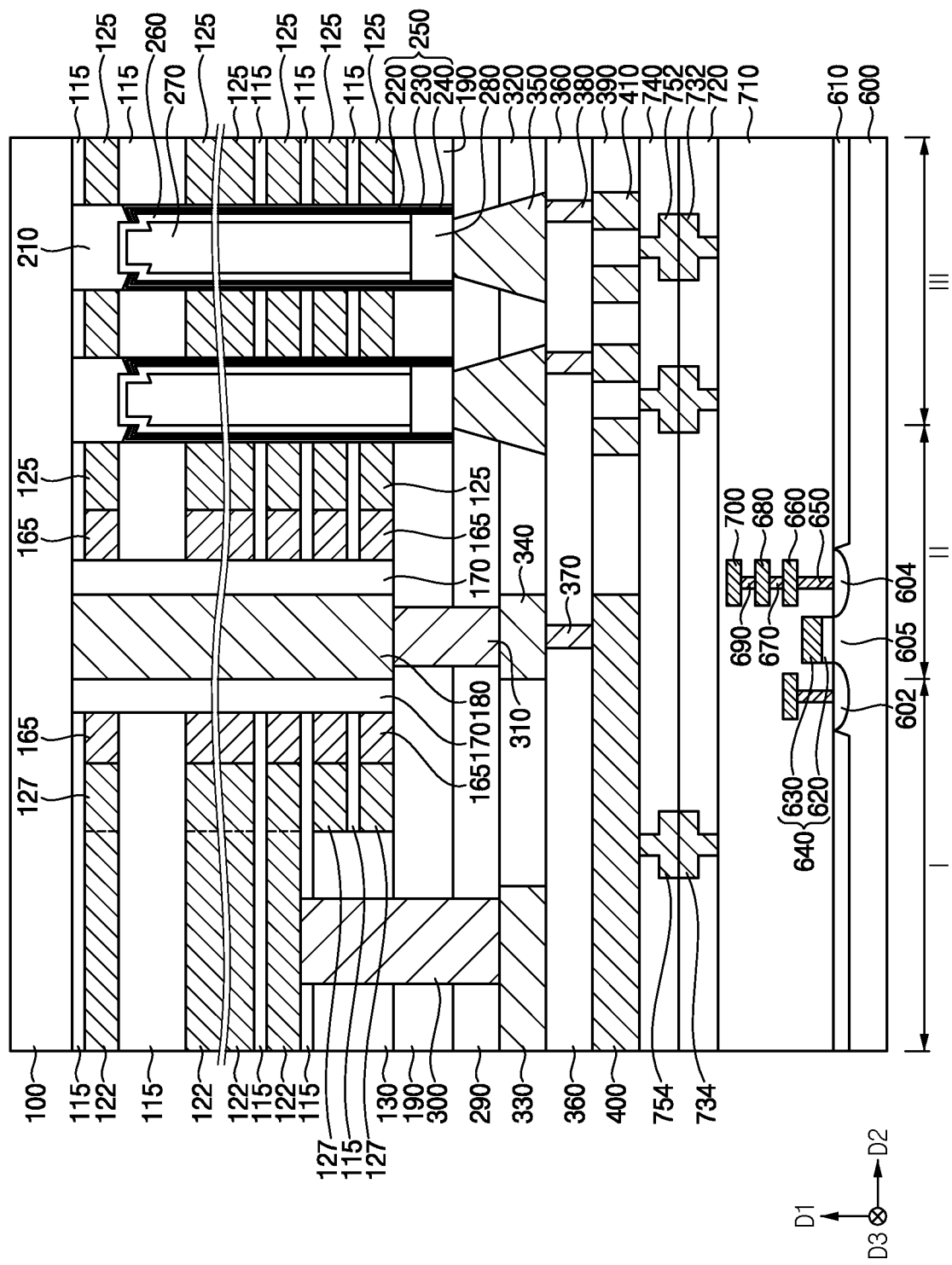
FIG. 33 is a cross-sectional view illustrating a semiconductor device in accordance with an example embodiment.

FIG. 33 is a cross-sectional view illustrating a semiconductor device in accordance with an example embodiment, which corresponds to FIG. 32. The semiconductor device may be substantially the same as or similar to that of FIG. 32, except that the semiconductor device is overturned and bonding structures are further formed, and thus repeated explanations thereof are omitted herein.

Referring to FIG. 33, second and third lower insulating interlayers 720 and 740 may be stacked in the first direction D1 on the first lower insulating interlayer 710.

First and second bonding patterns 732 and 734 may be formed through the second insulating interlayer 720, and third and fourth bonding patterns 752 and 754 may be formed through the third insulating interlayer 740. The first and third bonding patterns 732 and 752 may contact each other and form a first bonding structure, and the second and fourth bonding patterns 734 and 754 may contact each other to form a second bonding structure.

In an example embodiment, the second bonding structure is electrically connected to the fifth wiring 400, however, the inventive concept is not limited thereto.

Figure 34:
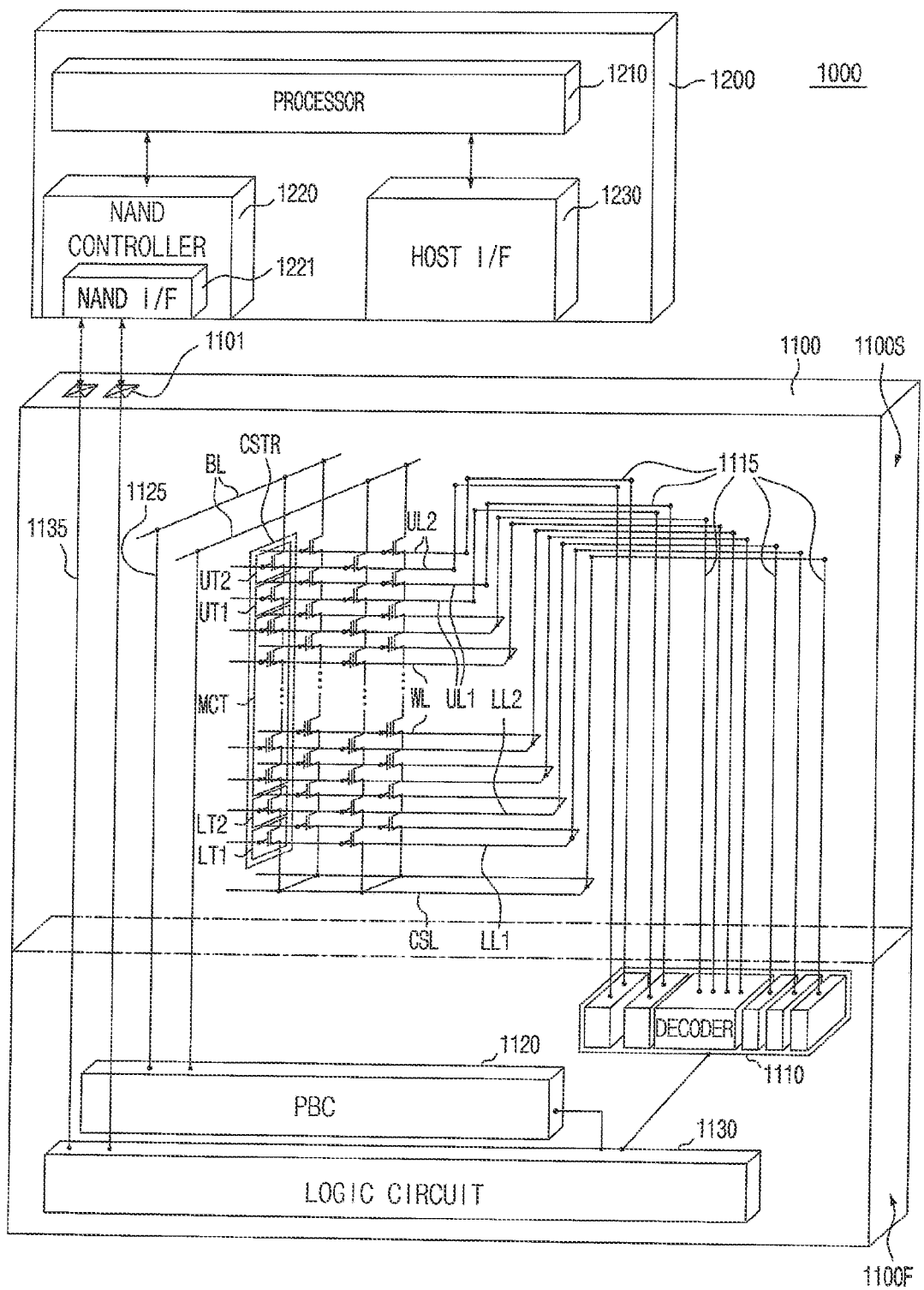
FIG. 34 is a schematic diagram illustrating an electronic system including a semiconductor device in accordance with an example embodiment.

FIG. 34 is a schematic diagram illustrating an electronic system including a semiconductor device in accordance with an example embodiment.

Referring to FIG. 34, an electronic system 1000 may include a semiconductor device 1100 (e.g., a semiconductor memory device) and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive (SSD) device, a universal serial bus (USB), a computing system, a medical device, or a communication device that may include one or a plurality of semiconductor devices 1100.

The semiconductor device 1100 may be a non-volatile memory device, for example, a NAND flash memory device illustrated with reference to FIGS. 1 to 5. The semiconductor device 1100 may include a first structure 1100F and a second structure 1100S disposed on the first structure 1100F. FIG. 34 shows that the first structure 1100F is under the second structure 1100S, however, the first structure 1100F may be formed at a side of or on the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In an example embodiment, the upper transistors UT1 and UT2 include string selection transistors, and the lower transistors LT1 and LT2 include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In an example embodiment, the lower transistors LT1 and LT2 include a lower erase control transistor LT1 and a ground selection transistor LT2 that are connected with each other in serial or in series. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through a gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100. The controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control command for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When a control command is received from the outside host through the host interface 1230, the processor 1210 may control the semiconductor device 1100 in response to the control command.

Figure 35:
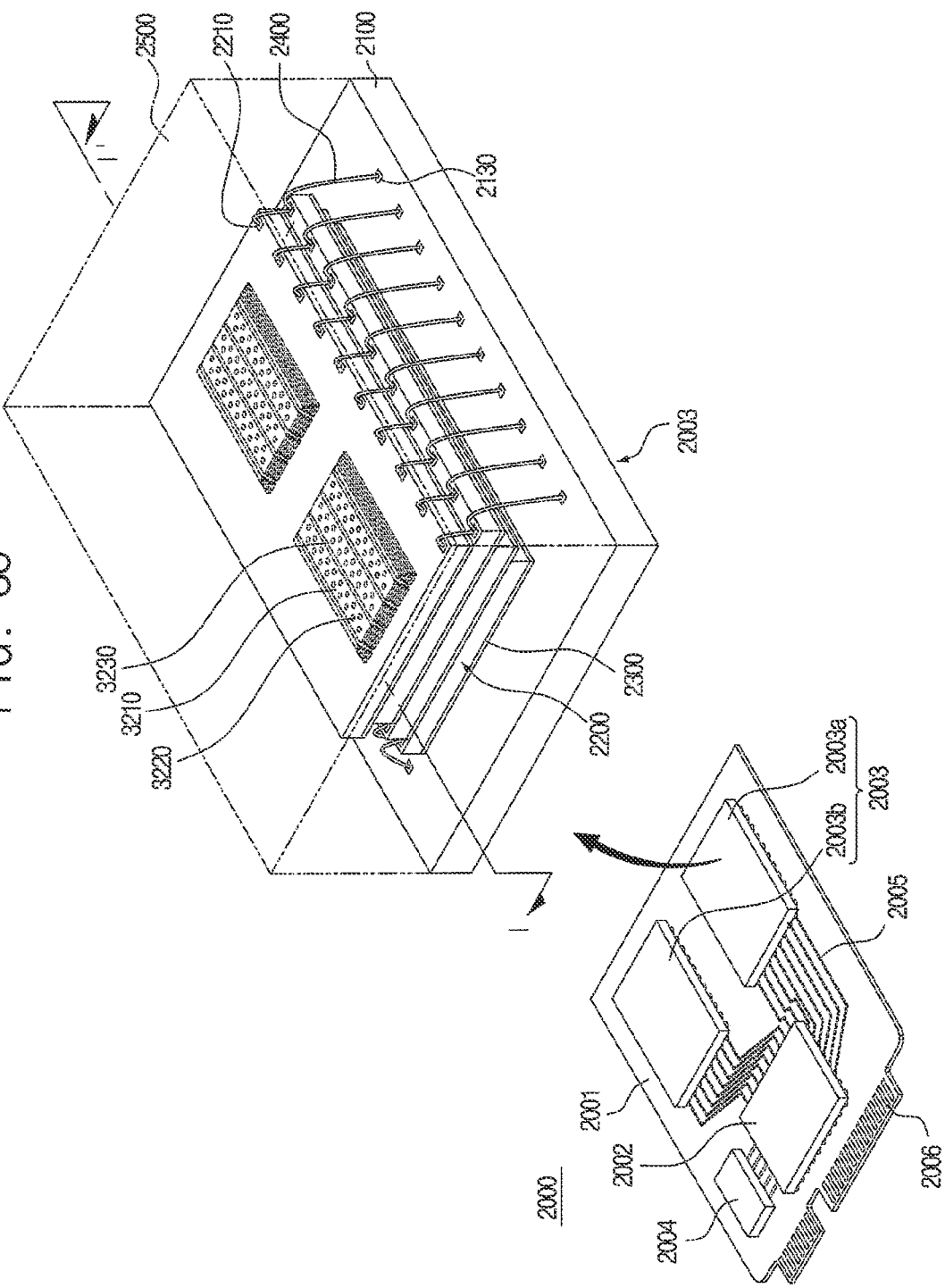
FIG. 35 is a schematic perspective view illustrating an electronic system including a semiconductor device in accordance with an example embodiment.

FIG. 35 is a schematic perspective view illustrating an electronic system including a semiconductor device in accordance with an example embodiment.

Referring to FIG. 35, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 by wiring patterns 2005 on the main substrate 2001.

The main substrate 2001 may include a connector 2006 having a plurality of pins connected to an outside host. The number and layout of the plurality pins in the connector 2006 may be changed depending on communication interface between the electronic system 2000 and the outside host. In example embodiments, the electronic system 2000 may communicate with the outside host according to one of a USB, peripheral component interconnect express (PCI-Express), serial advanced technology attachment (SATA), M-Phy for universal flash storage (UFS), etc. In example embodiments, the electronic system 2000 may be operated by power source provided from the outside host through the connector 2006. The electronic system 2000 may further include a power management integrated circuit (PMIC) for distributing the power source provided from the outside host to the controller 2002 and the semiconductor package 2003.

The controller 2002 may write data in the semiconductor package 2003 or read data from the semiconductor package 2003, and may enhance the operation speed of the electronic system 2000.

The DRAM device 2004 may be a buffer memory for reducing the speed difference between the semiconductor package 2003 for storing data and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages each where each may include a plurality of semiconductor chips 2200. Each of the first and second semiconductor packages 2003a and 2003b may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100.

The package substrate 2100 may be a printed circuit board (PCB) including package upper pads 2130. Each semiconductor chip 2200 may include an input/output pad 2210. The input/output pad 2210 may correspond to the input/output pad 1101 of FIG. 34. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device illustrated with reference to FIGS. 1 to 5.

In example embodiments, the connection structure 2400 may be a bonding wire for electrically connecting the input/output pad 2210 and the package upper pads 2130. Thus, in each of the first and second semiconductor packages 2003a and 2003b, the semiconductor chips 2200 may be electrically connected with each other by a bonding wire method, and may be electrically connected to the package upper pads 2130 of the package substrate 2100.

Alternatively, in each of the first and second semiconductor packages 2003a and 2003b, the semiconductor chips 2200 may be electrically connected with each other by a connection structure including a through silicon via (TSV), instead of the connection structure 2400 of the bonding wire method.

In example embodiments, the controller 2002 and the semiconductor chips 2200 may be included in one package. In example embodiments, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 36:
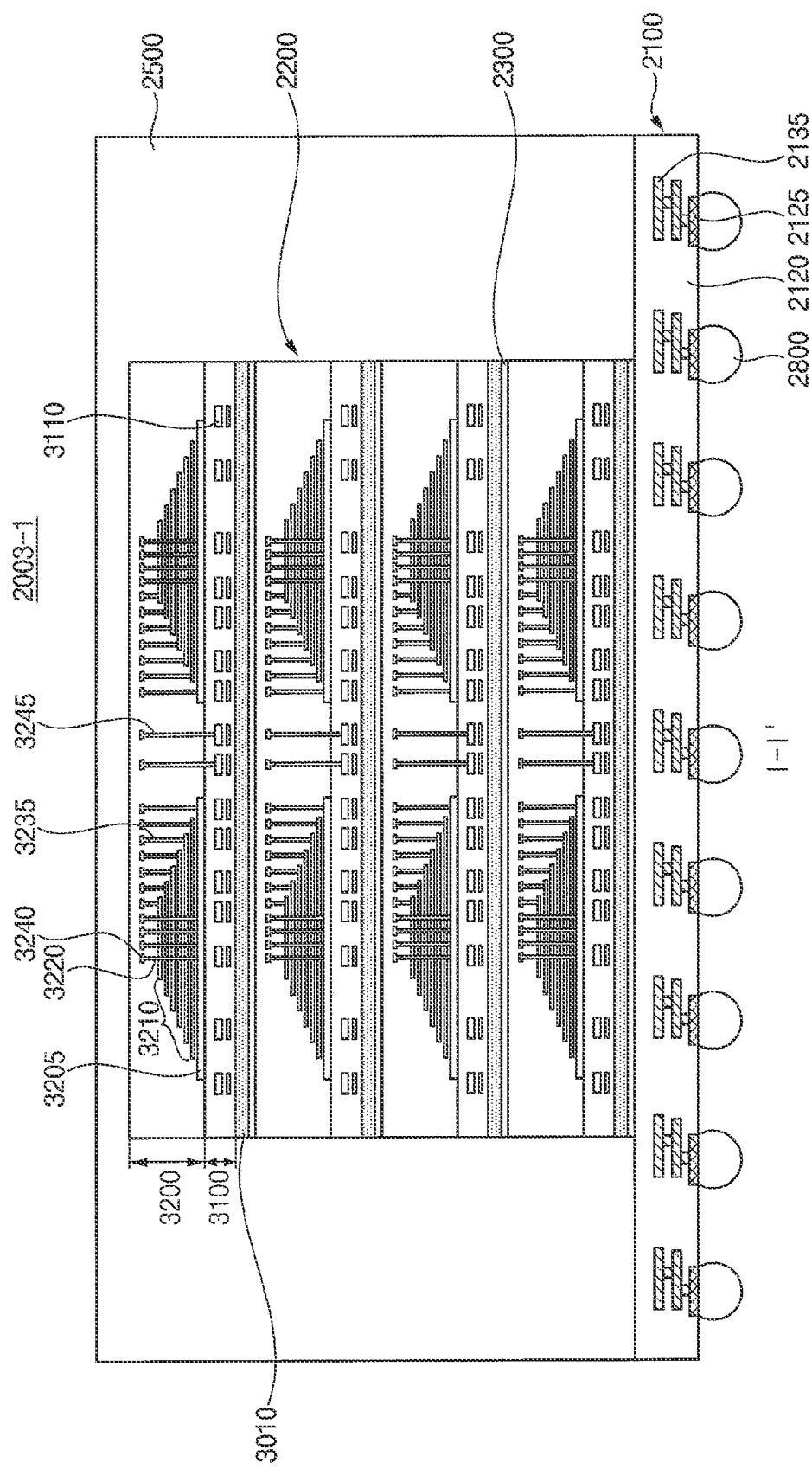
FIGS. 36 and 37 are schematic cross-sectional views illustrating a semiconductor package that may include a semiconductor device in accordance with an example embodiment.
Figure 37:
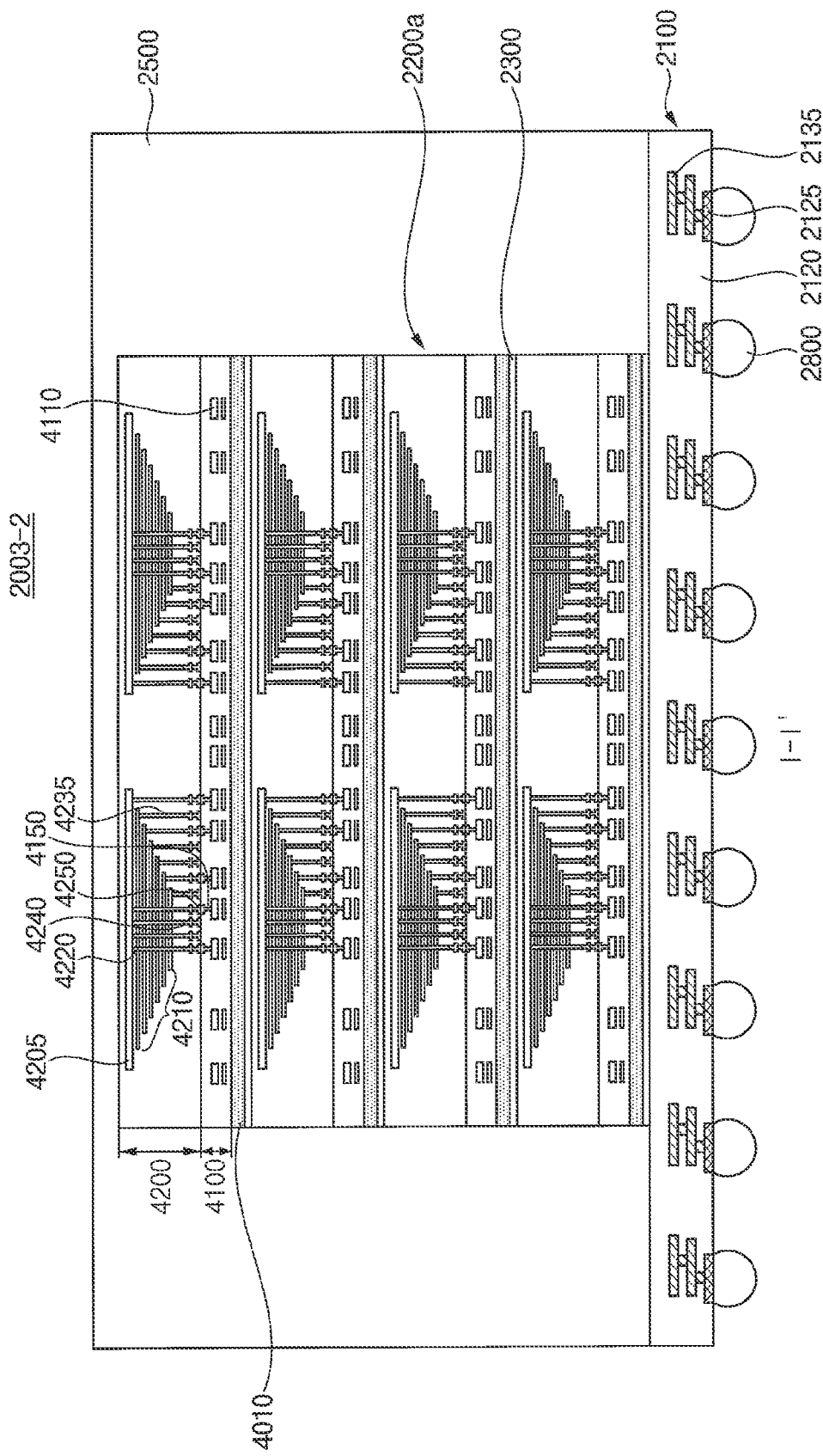

FIGS. 36 and 37 are schematic cross-sectional views illustrating a semiconductor package that may include a semiconductor device in accordance with example embodiments. FIGS. 36 and 37 illustrate example embodiments of the semiconductor package 2003 shown in FIG. 35, and show a cross-section taken along a line I-I' of the semiconductor package 2003 in FIG. 35.

Referring to FIG. 36, in a semiconductor package 2003-1, the package substrate 2100 may be a PCB. The package substrate 2100 may include a substrate body part 2120, upper pads 2130 (refer to FIG. 35) on an upper surface of the substrate body part 2120, lower pads 2125 on a lower surface of the substrate body part 2120 or exposed through the lower surface of the substrate body part 2120, and inner wirings 2135 for electrically connecting the upper pads 2130 and the lower pads 2125 in an inside of the substrate body part 2120. The upper pads 2130 may be electrically connected to the connection structures 2400. The lower pads 2125 may be connected to wiring patterns 2005 of the main substrate 2010 in the electronic system 2000 through conductive connection parts 2800, as shown in FIG. 35.

Each semiconductor chip 2200 may include a semiconductor substrate 3010, and a first structure 3100 and a second structure 3200 sequentially stacked on the semiconductor substrate 3010. The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 35) extending through the gate electrode structure 3210, bit lines 3240 electrically connected to the memory channel structures 3220, and gate connection wirings 3235 electrically connected to the word lines WL of the gate electrode structure 3210 (refer to FIG. 34).

Each semiconductor chip 2200 may include a through wiring 3245 being electrically connected to the peripheral circuit wirings 3110 of the first structure 3100 and extending in the second structure 3200. The through wiring 3245 may be disposed at an outside of the gate electrode structure 3210, and the through wirings 3245 may extend through the gate electrode structure 3210. Each semiconductor chip 2200 may further include the input/output pad 2210 (refer to FIG. 35) electrically connected to the peripheral circuit wirings 3110 of the first structure 3100.

Referring to FIG. 37, in a semiconductor package 2003-2, each semiconductor chip 2200a may include a semiconductor substrate 4010, a first structure 4100 disposed on the semiconductor substrate 4010, and a second structure 4200 disposed on and bonded with the first structure 4100 by a wafer bonding method.

The first structure 4100 may include a peripheral circuit region in which a peripheral circuit wiring 4110 and first bonding structures 4150 may be formed. The second structure 4200 may include a common source line 4205, a gate electrode structure 4210 between the common source line 4205 and the first structure 4100, memory channel structures 4220 and the division structure 3230 (refer to FIG. 35) extending through the gate electrode structure 4210, and second bonding structures 4250 electrically connected to the memory channel structures 4220 and the word lines WL (refer to FIG. 34) of the gate electrode structure 4210. For example, the second bonding structures 4250 may be electrically connected to the memory channel structures 4220 and the word lines WL (refer to FIG. 34) through the bit lines 4240 electrically connected to the memory channel structures 4220 and the gate connection wirings 4235 electrically connected to the word lines WL (refer to FIG. 34), respectively. The first bonding structures 4150 of the first structure 4100 and the second bonding structures 4250 of the second structure 4200 may contact each other to be bonded with each other. The first bonding structures 4150 and the second bonding structures 4250 may include, for example, copper.

Each semiconductor chip 2200a may further include the input/output pad 2210 (refer to FIG. 35) electrically connected to the peripheral circuit wirings 4110 of the first structure 4100.

The semiconductor chips 2200 of FIG. 36 and the semiconductor chips 2200a of FIG. 37 may be electrically connected with each other by the connection structures 2400 in a bonding wire method. However, in example embodiments, semiconductor chips such as the semiconductor chips 2200 of FIG. 36 and the semiconductor chips 2200a of FIG. 37 in the same semiconductor package may be electrically connected with each other by a connection structure including a TSV.

While example embodiments have been particularly shown and described, it will be understood by one of ordinary skill in the art that variations in form and detail may be made therein without departing from the spirit and scope of the claims.

What is claimed is:

1. A semiconductor device comprising:
   first gate electrodes stacked on a substrate in a first direction, each of the first gate electrodes extending in a second direction different from the first direction;
   horizontal channels contacting end portions in the second direction of the first gate electrodes, respectively;
   gate electrode connection portions contacting the horizontal channels, respectively;
   pads contacting the gate electrode connection portions, respectively;
   a vertical gate structure extending in the first direction through the horizontal channels on the substrate; and
   a memory channel structure extending through the first gate electrodes in the first direction on the substrate,
   wherein each of the horizontal channels surrounds a sidewall of the vertical gate structure.

2. The semiconductor device of claim 1, wherein each of the first gate electrodes, the gate electrode connection portions and the pads includes polysilicon doped with impurities having a first conductivity type.

3. The semiconductor device of claim 2, wherein each of the horizontal channels includes polysilicon doped with impurities having a second conductivity type that is opposite to the first conductivity type.

4. The semiconductor device of claim 1, wherein the vertical gate structure comprises:
   a second gate electrode extending in the first direction; and
   a gate insulation pattern covering a sidewall of the second gate electrode.

5. The semiconductor device of claim 4, wherein an upper surface of the second gate electrode is coplanar with an upper surface of an uppermost one of the first gate electrodes.

6. The semiconductor device of claim 1, wherein:
   the first gate electrodes stacked in the first direction form a first gate electrode structure,
   the first gate electrode structure is one of a plurality of first gate electrode structures spaced apart from each other in a third direction crossing the second direction, and the horizontal channel at each level is one of a plurality of horizontal channels spaced apart from each other in the third direction, and
   each of the gate electrode connection portions at each level extends in the third direction to commonly contact the plurality of horizontal channels disposed in the third direction.

7. The semiconductor device of claim 6, wherein the pads are arranged in the third direction.

8. The semiconductor device of claim 6, further comprising first contact plugs disposed on each of the pads, respectively.

9. The semiconductor device of claim 8, wherein the vertical gate structure is one of a plurality of vertical gate structures spaced apart from each other in the third direction, and
   wherein the semiconductor device further comprises second contact plugs disposed on the plurality of vertical gate structures, respectively.

10. The semiconductor device of claim 9, further comprising a wiring disposed on and electrically connected to each of the second contact plugs, the wiring extending in the second direction.

11. A semiconductor device comprising:
    first gate electrodes stacked on a substrate in a first direction perpendicular to an upper surface of the substrate, each of the first gate electrodes extending in a second direction parallel to the upper surface of the substrate;
    horizontal channels contacting end portions in the second direction of the first gate electrodes, respectively;
    gate electrode connection portions contacting the horizontal channels, respectively;
    pads contacting the gate electrode connection portions, respectively;
    a vertical gate structure extending in the first direction through the horizontal channels on the substrate; and
    a memory channel structure extending through the first gate electrodes in the first direction on the substrate,
    wherein an upper surface of the vertical gate structure in the first direction is substantially coplanar with an upper surface of an uppermost one of the first gate electrodes.

12. The semiconductor device of claim 11, wherein each of the first gate electrodes, the gate electrode connection portions and the pads includes polysilicon doped with impurities having a first conductivity type.

13. The semiconductor device of claim 12, wherein each of the horizontal channels includes polysilicon doped with impurities having a second conductivity type that is opposite to the first conductivity type.

14. The semiconductor device of claim 11, wherein the vertical gate structure comprises:
    a second gate electrode extending in the first direction; and
    a gate insulation pattern covering a sidewall of the second gate electrode.

15. The semiconductor device of claim 11, wherein:
    the first gate electrodes stacked in the first direction form a first gate electrode structure,
    the first gate electrode structure is one of a plurality of first gate electrode structures spaced apart from each other in a third direction parallel to the upper surface of the substrate and crossing the second direction, and the horizontal channel at each level is one of a plurality of horizontal channels spaced apart from each other in the third direction, and
    each of the gate electrode connection portions at each level extends in the third direction to commonly contact the plurality of horizontal channels disposed in the third direction.

16. The semiconductor device of claim 15, wherein the pads are arranged in the third direction.

17. The semiconductor device of claim 16, further comprising first contact plugs disposed on the pads, respectively.

18. A semiconductor device comprising:
    first gate electrode structures disposed on a first region of a substrate, the substrate including the first region, a second region and a third region, each of the first gate electrode structures including first gate electrodes stacked on the substrate in a first direction, each of the first gate electrodes extending in a second direction different from the first direction, and the first gate electrode structures being disposed in a third direction crossing the second direction;
    horizontal channel structures disposed on the second region of the substrate, each of the horizontal channel structures including horizontal channels contacting end portions in the second direction of the first gate electrodes, respectively, and the horizontal channel structures being disposed in the third direction;
    gate electrode connection portions disposed on the third region of the substrate, each of the gate electrode connection portions extending in the third direction and commonly contacting the horizontal channels disposed in the third direction;

pads disposed on the third region of the substrate, the pads contacting the gate electrode connection portions, respectively;

vertical gate structures disposed on the second region of the substrate, each of the vertical gate structures extending in the first direction through a corresponding one of the horizontal channel structures;

memory channel structures disposed on the first region of the substrate, each of the memory channel structures extending in the first direction through a corresponding one of the first gate electrodes;

first division patterns contacting the upper surface of the substrate, each of the first division patterns extending in the second direction between the first gate electrode structures and between the horizontal channel structures on the first and second regions of the substrate;

second division patterns contacting the upper surface of the substrate, each of the second division patterns extending in the second direction between the horizontal channel structures on the second region of the substrate; and third division patterns extending in the second direction on the first region of the substrate, the third division patterns being connected to corresponding ones of the second division patterns, respectively, wherein each of the first division patterns is disposed between the memory channel structures, and each of the third division patterns extends through upper portions of ones of the memory channel structures.

19. The semiconductor device of claim 18, wherein the second division patterns are spaced apart from each other in the third direction between ones of the first division patterns neighboring in the third direction.

* * * * *